US010026661B2

(12) United States Patent
Won et al.

(10) Patent No.: US 10,026,661 B2
(45) Date of Patent: Jul. 17, 2018

(54) SEMICONDUCTOR DEVICE FOR TESTING LARGE NUMBER OF DEVICES AND COMPOSING METHOD AND TEST METHOD THEREOF

(71) Applicants: Hyosig Won, Suwon-si (KR); DaiJoon Hyun, Seoul (KR); Kwangok Jeong, Hwaseong-si (KR)

(72) Inventors: Hyosig Won, Suwon-si (KR); DaiJoon Hyun, Seoul (KR); Kwangok Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/844,398

(22) Filed: Sep. 3, 2015

(65) Prior Publication Data

US 2016/0086863 A1 Mar. 24, 2016

Related U.S. Application Data

(60) Provisional application No. 62/052,076, filed on Sep. 18, 2014.

(30) Foreign Application Priority Data

Jan. 9, 2015 (KR) .................. 10-2015-0003369

(51) Int. Cl.
*G01R 31/26* (2014.01)
*G01R 31/27* (2006.01)
(Continued)

(52) U.S. Cl.
CPC .......... *H01L 22/14* (2013.01); *G01R 31/2601* (2013.01); *G01R 31/2621* (2013.01);
(Continued)

(58) Field of Classification Search
CPC ......... H01L 22/14; H01L 22/32; H01L 22/34; G01R 31/2601; G01R 31/2621
(Continued)

(56) References Cited

U.S. PATENT DOCUMENTS 5,661,419 A 8/1997 Bhagwan
6,423,558 B1 7/2002 Maeda et al.
(Continued)

FOREIGN PATENT DOCUMENTS

JP H11148964 A 6/1999
JP H11211793 A 8/1999
(Continued)

OTHER PUBLICATIONS

"Standard cell", Wikipedia, The Free Encyclopedia, Sep. 5, 2013.*
(Continued)

*Primary Examiner* — Julio J Maldonado
*Assistant Examiner* — Molly Reida
(74) *Attorney, Agent, or Firm* — Harness, Dickey & Pierce, P.L.C.

(57) ABSTRACT

Provided is a method for testing a plurality of transistors of a semiconductor device. The method includes forming a plurality of elements or a plurality of logic using a Front End Of Line (FEOL) process, forming a selection logic using at least one of the plurality of elements or the plurality of logic cells, connecting the selection logic and the plurality of transistors, forming a pad for connecting an input terminal of the selection logic and drain or source terminals of the plurality of transistors, and sequentially selecting the plurality of transistors using the selection logic and measuring an electrical characteristic of selected transistors among the plurality of transistors.

19 Claims, 20 Drawing Sheets

(51) Int. Cl.
*H01L 21/66* (2006.01)
*G11C 29/50* (2006.01)
*H01L 21/8234* (2006.01)
*G11C 11/417* (2006.01)
*G11C 29/04* (2006.01)

(52) U.S. Cl.
CPC ...... *G11C 29/50* (2013.01); *H01L 21/823475* (2013.01); *H01L 22/32* (2013.01); *H01L 22/34* (2013.01); *G11C 11/417* (2013.01); *G11C 2029/0403* (2013.01); *G11C 2029/5004* (2013.01); *G11C 2029/5006* (2013.01)

(58) Field of Classification Search
USPC ............. 438/17, 18; 324/527, 750.01, 750.3, 324/762.03, 762.05, 762.09
See application file for complete search history.

(56) References Cited

U.S. PATENT DOCUMENTS

| | | | |
|---|---|---|---|
| 6,469,493 B1 | 10/2002 | Muething, Jr. et al. | |
| 6,532,579 B2 | 3/2003 | Sato et al. | |
| 6,662,350 B2 | 12/2003 | Fried et al. | |
| 7,102,413 B2 | 9/2006 | Kuroda | |
| 7,547,597 B2 | 6/2009 | Kau et al. | |
| 7,685,540 B1 | 3/2010 | Madden et al. | |
| 7,917,872 B2 | 3/2011 | Tanefusa et al. | |
| 7,956,421 B2 | 6/2011 | Becker | |
| 7,960,759 B2 | 6/2011 | Frederick et al. | |
| 8,102,018 B2 | 1/2012 | Bertin et al. | |
| 8,138,783 B2 | 3/2012 | Rius Vazquez et al. | |
| 8,183,114 B2 | 5/2012 | Tsuboi et al. | |
| 8,224,604 B1 | 7/2012 | Amrutur et al. | |
| 8,239,803 B2 | 8/2012 | Kobayashi | |
| 8,258,578 B2 | 9/2012 | Carlson | |
| 8,264,044 B2 | 9/2012 | Becker | |
| 8,281,272 B1 | 10/2012 | Ginetti | |
| 8,312,394 B2 | 11/2012 | Ban et al. | |
| 8,352,899 B1 | 1/2013 | Yap et al. | |
| 8,362,480 B1 | 1/2013 | Hess et al. | |
| 8,365,108 B2 | 1/2013 | Baum et al. | |
| 8,397,193 B2 | 3/2013 | Ting et al. | |
| 8,490,244 B1 | 7/2013 | Joshi et al. | |
| 8,543,089 B2 | 9/2013 | Chun et al. | |
| 8,569,841 B2 | 10/2013 | Becker et al. | |
| 8,581,348 B2 | 11/2013 | Rashed et al. | |
| 8,631,382 B2 | 1/2014 | Wang et al. | |
| 8,653,630 B2 | 2/2014 | Liaw et al. | |
| 8,689,157 B1 | 4/2014 | Lo et al. | |
| 8,726,215 B2 | 5/2014 | Lee et al. | |
| 8,726,217 B2 | 5/2014 | Gullette | |
| 8,726,220 B2 | 5/2014 | Lin et al. | |
| 8,732,641 B1 | 5/2014 | Yuh et al. | |
| 8,741,763 B2 | 6/2014 | Ma et al. | |
| 8,775,977 B2 | 7/2014 | Hsu et al. | |
| 8,775,999 B2 | 7/2014 | Chueh et al. | |
| 8,782,575 B1 | 7/2014 | Hsu et al. | |
| 8,782,586 B2 | 7/2014 | Sezginer et al. | |
| 8,799,834 B1 | 8/2014 | Chen et al. | |
| 8,802,574 B2 | 8/2014 | Yuan et al. | |
| 8,826,213 B1 | 9/2014 | Ho et al. | |
| 8,853,794 B2 | 10/2014 | Becker et al. | |
| 8,878,303 B2 | 11/2014 | Hatamian et al. | |
| 8,902,094 B1 | 12/2014 | Zhang et al. | |
| 8,904,337 B2 | 12/2014 | Yang et al. | |
| 8,924,908 B2 | 12/2014 | Kawa et al. | |
| 8,946,824 B2 | 2/2015 | Ikegami et al. | |
| 8,947,912 B2 | 2/2015 | Calhoun et al. | |
| 8,969,199 B1 | 3/2015 | Yuan et al. | |
| 8,987,128 B2 | 3/2015 | Rashed et al. | |
| 8,997,026 B1 | 3/2015 | Sweis | |
| 9,009,641 B2 | 4/2015 | Becker et al. | |
| 9,021,405 B2 | 4/2015 | Hiramoto et al. | |
| 9,035,393 B2 | 5/2015 | Ma et al. | |
| 9,355,910 B2 | 5/2016 | Rashed et al. | |
| 9,740,811 B2 | 8/2017 | Chen et al. | |
| 2001/0044918 A1 | 11/2001 | Sato et al. | |
| 2003/0016551 A1 | 1/2003 | Takemura et al. | |
| 2003/0145299 A1 | 7/2003 | Fried et al. | |
| 2003/0200493 A1 | 10/2003 | Campbell | |
| 2003/0200512 A1 | 10/2003 | Lam | |
| 2004/0012429 A1 | 1/2004 | Lindberg et al. | |
| 2004/0109368 A1 | 6/2004 | Kuroda | |
| 2004/0133868 A1 | 7/2004 | Ichimiya | |
| 2005/0044522 A1 | 2/2005 | Maeda | |
| 2005/0155001 A1 | 7/2005 | Kinoshita et al. | |
| 2006/0136848 A1 | 6/2006 | Ichiryu et al. | |
| 2006/0225016 A1 | 10/2006 | Fukasawa | |
| 2006/0267224 A1 | 11/2006 | Kau et al. | |
| 2006/0288315 A1 | 12/2006 | Perez et al. | |
| 2007/0075718 A1* | 4/2007 | Hess | H01L 22/34 324/762.05 |
| 2008/0046849 A1 | 2/2008 | Choi | |
| 2008/0109778 A1 | 5/2008 | Hsieh | |
| 2008/0216041 A1 | 9/2008 | Wangxiao et al. | |
| 2008/0270064 A1* | 10/2008 | Bhushan | G01R 31/31722 702/119 |
| 2009/0037855 A1 | 2/2009 | Tanefusa et al. | |
| 2009/0091346 A1 | 4/2009 | Chuang et al. | |
| 2009/0144677 A1 | 6/2009 | Gonzalez et al. | |
| 2009/0224317 A1 | 9/2009 | Becker | |
| 2009/0315583 A1 | 12/2009 | Rius Vazquez et al. | |
| 2010/0090260 A1 | 4/2010 | Frederick et al. | |
| 2010/0093145 A1 | 4/2010 | Tsuboi et al. | |
| 2010/0187615 A1 | 7/2010 | Becker | |
| 2010/0201376 A1* | 8/2010 | Ouyang | G11C 29/50 324/551 |
| 2010/0252892 A1 | 10/2010 | Becker | |
| 2010/0269073 A1 | 10/2010 | Ting et al. | |
| 2011/0014786 A1 | 1/2011 | Sezginer et al. | |
| 2011/0049635 A1 | 3/2011 | Carlson | |
| 2011/0131440 A1 | 6/2011 | Noda | |
| 2011/0289467 A1 | 11/2011 | Kobayashi | |
| 2012/0137261 A1 | 5/2012 | Ban et al. | |
| 2012/0180006 A1 | 7/2012 | Baum et al. | |
| 2012/0192135 A1 | 7/2012 | Gullette | |
| 2012/0210279 A1 | 8/2012 | Hsu et al. | |
| 2012/0254817 A1 | 10/2012 | Sherlekar | |
| 2012/0278777 A1 | 11/2012 | Lin et al. | |
| 2012/0299065 A1 | 11/2012 | Shimizu | |
| 2012/0329266 A1 | 12/2012 | Hiramoto et al. | |
| 2013/0016982 A1 | 1/2013 | Henzler | |
| 2013/0021075 A1 | 1/2013 | Felix | |
| 2013/0026572 A1 | 1/2013 | Kawa et al. | |
| 2013/0036397 A1 | 2/2013 | Lee et al. | |
| 2013/0042216 A1 | 2/2013 | Loh et al. | |
| 2013/0086542 A1 | 4/2013 | Teoh et al. | |
| 2013/0126978 A1 | 5/2013 | Becker et al. | |
| 2013/0146982 A1 | 6/2013 | Rashed et al. | |
| 2013/0200395 A1 | 8/2013 | Liaw et al. | |
| 2013/0239077 A1 | 9/2013 | Wang et al. | |
| 2013/0242645 A1 | 9/2013 | Calhoun et al. | |
| 2013/0244427 A1 | 9/2013 | Yuan et al. | |
| 2013/0292772 A1 | 11/2013 | Ma et al. | |
| 2013/0298092 A1 | 11/2013 | Ting et al. | |
| 2013/0320451 A1 | 12/2013 | Liu et al. | |
| 2014/0027918 A1 | 1/2014 | Rashed et al. | |
| 2014/0054722 A1 | 2/2014 | Kawa et al. | |
| 2014/0119099 A1 | 5/2014 | Clark et al. | |
| 2014/0130003 A1 | 5/2014 | Cheuh et al. | |
| 2014/0131816 A1 | 5/2014 | Wang et al. | |
| 2014/0137062 A1 | 5/2014 | Yuh et al. | |
| 2014/0183646 A1 | 7/2014 | Hatamian et al. | |
| 2014/0185365 A1 | 7/2014 | Liaw | |
| 2014/0189635 A1 | 7/2014 | Yang et al. | |
| 2014/0203378 A1 | 7/2014 | Ou et al. | |
| 2014/0208282 A1 | 7/2014 | Hsu et al. | |
| 2014/0210014 A1 | 7/2014 | Ma et al. | |
| 2014/0210015 A1 | 7/2014 | Becker et al. | |
| 2014/0255164 A1 | 9/2014 | Hayes-Pankhurst et al. | |
| 2014/0264894 A1 | 9/2014 | Tien et al. | |
| 2014/0282325 A1 | 9/2014 | Chen et al. | |
| 2014/0344770 A1 | 11/2014 | Chiang et al. | |

(56) References Cited

U.S. PATENT DOCUMENTS

| | | |
|---|---|---|
| 2015/0093910 A1 | 4/2015 | Tan et al. |
| 2015/0143309 A1 | 5/2015 | De Dood et al. |
| 2015/0213184 A1 | 7/2015 | Yuan et al. |
| 2015/0234977 A1 | 8/2015 | Lee |
| 2015/0287604 A1 | 10/2015 | Stephens et al. |
| 2015/0370949 A1 | 12/2015 | Moroz et al. |
| 2015/0370950 A1 | 12/2015 | Kawa et al. |
| 2016/0025805 A1* | 1/2016 | Uppal ............... G01R 31/2884 324/750.3 |
| 2016/0055290 A1 | 2/2016 | Weng |

FOREIGN PATENT DOCUMENTS

| | | |
|---|---|---|
| JP | 2003050266 A | 2/2003 |
| JP | 2003149983 A | 5/2003 |
| JP | 2005149313 A1 | 6/2005 |
| JP | 2005252143 A | 9/2005 |
| JP | 2007264993 A | 10/2007 |
| JP | 2007324319 A | 12/2007 |
| JP | 2010266254 A | 11/2010 |
| JP | 2011233869 A | 11/2011 |
| JP | 2013120852 A | 6/2013 |
| JP | 2014131063 A | 7/2014 |
| KR | 20000003218 A | 1/2000 |
| KR | 20070109434 A | 11/2007 |
| KR | 20080045517 A | 5/2008 |
| KR | 20120125275 A | 11/2012 |
| KR | 20130067213 A | 6/2013 |
| KR | 20140012012 A | 1/2014 |
| KR | 20140043399 A | 4/2014 |

OTHER PUBLICATIONS

"Binary Decoder", Electronics Tutorials, Jul. 15, 2014.*
U.S. Office Action dated Sep. 12, 2016 issued in co-pending U.S. Appl. No. 14/848,758.
Christopher Hess et al., "Direct Probing Characterization Vehicle Test Chip for Wafer Level Exploration of Transistor Pattern on Product Chips", IEEE Conference on Microelectronic Test Structures, 2014, p. 219-223.
U.S. Office Action dated Oct. 21, 2016 issued in co-pending U.S. Appl. No. 14/854,358.
U.S. Notice of Allowance dated Feb. 16, 2017 issued in co-pending U.S. Appl. No. 14/848,758.
U.S. Notice of Allowance dated Mar. 2, 2017 issued in co-pending U.S. Appl. No. 14/854,358.
U.S. Office Action dated Jan. 26, 2017 issued in copending U.S. Appl. No. 14/844,420.
U.S. Appl. No. 14/854,358, filed Sep. 15, 2015.
U.S. Appl. No. 14/844,420, filed Sep. 3, 2015.
U.S. Appl. No. 14/848,758, filed Sep. 9, 2015.
Notice of Allowance dated May 15, 2017 issued in co-pending U.S. Appl. No. 14/844,420.
U.S. Appl. No. 14/843,491, filed Sep. 2, 2015.
U.S. Appl. No. 15/614,911, filed Jun. 6, 2017.
U.S. Appl. No. 15/711,390, filed Sep. 21, 2017.
U.S. Office Action dated Oct. 19, 2017 issued in co-pending U.S. Appl. No. 15/711,390.
U.S. Office Action dated Oct. 20, 2017 issued in co-pending U.S. Appl. No. 14/843,491.
Office Action for corresponding U.S. Appl. No. 14/843,491 dated Mar. 5, 2018.
U.S. Office Action dated Apr. 20, 2018 issued in co-pending U.S. Appl. No. 15/614,911.
U.S. Notice of Allowance dated May 22, 2018 issued in co-pending U.S. Appl. No. 14/843,491.

* cited by examiner

SEMICONDUCTOR DEVICE FOR TESTING LARGE NUMBER OF DEVICES AND COMPOSING METHOD AND TEST METHOD THEREOF

CROSS-REFERENCE TO RELATED APPLICATIONS

A claim for priority under 35 U.S.C. § 119 is made to U.S. Patent Provisional No. 62/052,076 filed Sep. 18, 2014, in the U.S. Patent and Trademark Office, and Korean Patent Application No. 10-2015-0003369 filed Jan. 9, 2015, in the Korean Intellectual Property Office, the entire contents of each of the above-referenced applications are hereby incorporated by reference.

BACKGROUND

The present disclosure relates to a semiconductor device, and more particularly, relates to a semiconductor device and a device test method capable of effectively measuring current-voltage characteristics of a large number of devices of a semiconductor device.

In recent years, the use of mobile devices, such as a smart phone, a tablet PC, a digital camera, an MP3 player, a PDA, etc., has increased. In such mobile devices, driving of multimedia and throughput of various data are increased, and a high-speed processor and a mass storage medium are used. A variety of application programs are driven on the mobile device. The mobile device may use semiconductor devices, such as a working memory (e.g., DRAM), a nonvolatile memory, and an application processor (hereinafter referred to as "AP"), to drive various application programs.

If a new process for manufacturing a semiconductor device is used, characteristics of transistors of the semiconductor may be monitored to increase yield. After manufacturing a chip including semiconductor elements for test, a test may be performed using pads formed on the chip experiencing a Front End Of Line (FEOL) process. This test method may use three pads to measure a DC characteristic of a transistor.

SUMMARY

Example embodiments of inventive concepts provide semiconductor devices and element measuring methods capable of measuring elements of a semiconductor device as possible as many.

Example embodiments of inventive concepts relate to a method for testing a plurality of transistors of a semiconductor device. The method includes forming a plurality of elements or a plurality of logic cells using a Front End Of Line (FEOL) process; forming a selection logic using at least one of the plurality of elements or the plurality of logic cells; connecting the selection logic and the plurality of transistors; forming a pad for connecting an input terminal of the selection logic and drain or source terminals of the plurality of transistors; and sequentially selecting the plurality of transistors using the selection logic and measuring an electrical characteristic of one selected transistor among the plurality of transistors.

In example embodiments, the plurality of elements may be elements placed a specific chip area of the semiconductor device.

In example embodiments, the plurality of logic cells may be standard logic cells at the semiconductor device.

In example embodiments, the plurality of logic cells may include logic filler cells that are cells assigned to filler cells at a design level of the semiconductor device, and the logic filler cells may be formed to have the same function of a standard logic cell.

In example embodiments, the logic filler cells and the standard logic cells may each include input and output terminals, and the FEOL process of the forming the plurality of elements or the plurality of logic cells may include forming the input and output terminals of the logic filler cells so they are separated from the input and output terminals of the standard logic cells.

In example embodiments, the selection logic may be implemented with a decoder intellectual property (IP) formed at a specific chip area according to locations of the plurality of transistors at a design level of the semiconductor device.

In example embodiments, the forming the selection logic may include routing a decoder circuit previously formed for a specific function at the semiconductor device.

In example embodiments, the method may further include removing vias and metal lines formed at an upper layer portion of the plurality of elements or the plurality of logic cells formed at the semiconductor device after the FEOL process is performed.

In example embodiments, the method may further include forming a contact or a conductive line for forming the selection logic after the removing the vias and the metal lines.

Example embodiments of inventive concepts relate to a semiconductor device for test that includes a plurality of transistors to be tested, each of the transistors having a source and a drain; a decoder configured to select one of the plurality of transistors in response to a selection signal, the decoder formed by synthesizing at least one of a plurality of logic cells and a plurality of elements after a FEOL process; and a plurality of pads connected with the sources or the drains, the pads being configured to provide the selection signal to the decoder.

In example embodiments, the plurality of logic cells may include at least one of standard logic cells, logic filler cells, and logic cells formed at a spare area.

In example embodiments, the logic filler cells may be filler cells formed to have a logic function at the FEOL process.

In example embodiments, the plurality of logic cells and the plurality of elements may be formed at a chip area previously selected for a test a design level of the semiconductor device for test.

In example embodiments, the decoder may include an intellectual property (IP) at specific chip areas of the semiconductor device for test.

In example embodiments, after the FEOL process, the decoder and the pads or the decoder and the plurality of transistors may be electrically connected through routing using conductive lines or vias.

In example embodiments, the decoder may be formed through routing about a row decoder or a column decoder of a memory circuit formed at the semiconductor device for test.

In example embodiments, the memory circuit may correspond to an SRAM area.

Example embodiments of inventive concepts relate to a method for forming a semiconductor device for test. The method includes disposing at least one of elements, logic cells, and intellectual properties (IPs) for forming a decoder at a chip area of the semiconductor device for test; forming transistors and the at least one of elements, logic cells, and IPs at the semiconductor device for test using a FEOL process, the transistors including drains and sources; forming a decoder for sequentially selecting the transistors in response to a selection signal; and connecting the decoder to the transistors; and forming a pad for connecting an input terminal of the decoder to the drains or sources of the transistors.

In example embodiments, the disposing the transistor and the at least one of elements, logic cells, and intellectual properties (IPs) may include selecting an element or logic cell configured to perform a specific function among the elements or the logic cells.

In example embodiments, the forming the decoder may include selecting one of the standard cells or elements corresponding to positions where minimum conductive lines are needed when forming the decoder, and forming the decoder from the selected one of the standard cell or elements.

In example embodiments, the forming the decoder may include selecting one of the standard cells or elements having a size larger than a reference size and modifying the selected one of the standard cells or elements into the decoder.

In example embodiments, the disposing may include deciding the number, locations, and a decoding size of the IPs according to the pad and the number of transistors or locations of the pad and the transistors.

In example embodiments, the method may further include removing vias or metal lines after the FEOL process.

According to example embodiments of inventive concepts, a method for testing target transistors on a Front End of Line (FEOL)-end-semiconductor device is provided. The FEOL-end semiconductor device includes target transistors and at least one of a plurality of elements and a plurality of logic cells formed using a FEOL process. The target transistors each include a source, a gate, and a drain. The method includes: forming a decoder by modifying the at least one of the plurality of elements and the plurality of logic cells on the FEOL-end semiconductor device; forming a pad pattern, the pad pattern defining an input terminal connected to the decoder, a source terminal connected to the source of at least one of the target transistors, and a drain terminal connected to the drain of at least one of the target transistors; connecting the decoder to the gates of the target transistors; and selecting one of the target transistors using the decoder and measuring an electrical characteristic of the selected one of the target transistors using the source terminal and the drain terminal.

In example embodiments, the sources of the target transistors may be connected to a common source, the drains of the target transistors may be connected to a common drain, and the forming the pad pattern may include forming the source terminal connected to the common source and forming the drain terminal connected to the common drain.

In example embodiments, the at least one of the plurality of elements and the plurality of logic cells on the FEOL-end-semiconductor device may be connected to vias and metal lines, and the forming the decoder my include removing the vias and the metal lines connected to the at least one of the plurality of elements and the plurality of logic cells on the FEOL-end-semiconductor device and routing a new interconnection structure to the at least one of the plurality of elements and the plurality of logic cells being modified into the decoder.

In example embodiments, the FEOL-end-semiconductor device my include a circuit block divided into a plurality of rails on the basis of power rails. Each of the rows may include standard logic cells, logic filler cells, and general filler cells. The forming the decoder may include modifying one of the logic filler cells into the decoder. The connecting the decoder to the gates of the target transistors may include connecting the decoder to gates of the standard logic cells in a same row as the decoder.

In example embodiments, the forming the decoder may include forming the decoder to include at least one inverter and at least one NAND gate.

BRIEF DESCRIPTION OF THE FIGURES

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
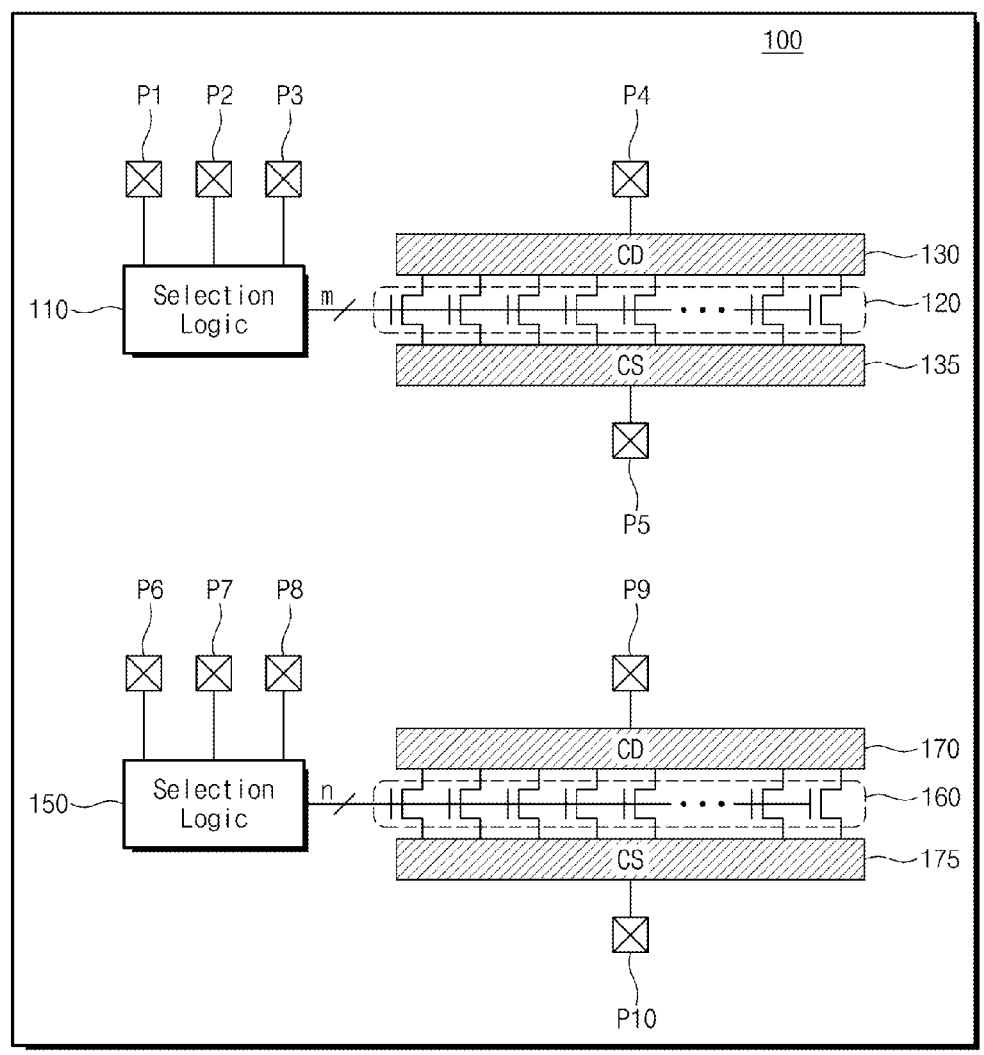
FIG. 1 is a block diagram schematically illustrating a semiconductor device for test according to example embodiments of inventive concepts.

Example embodiments will be described in detail with reference to the accompanying drawings, in which some example embodiments are shown. Example embodiments of inventive concepts, however, may be embodied in various different forms, and should not be construed as being limited only to the illustrated embodiments. Rather, these example embodiments are provided as examples so that this disclosure will be thorough and complete, and will fully convey the scope of inventive concepts to those skilled in the art. Accordingly, known processes, elements, and techniques may not described with respect to example embodiments of inventive concepts. Unless otherwise noted, like reference numerals denote like elements throughout the attached drawings and written description, and thus descriptions may not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration. Expressions such as "at least one of," when preceding a list of elements, modify the entire list of elements and do not modify the individual elements of the list.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram schematically illustrating a semiconductor device for test according to example embodiments of inventive concepts. Referring to FIG. 1, a semiconductor device for test 100 forms at least one selection logics 110 and 150 at a chip of which the Front End Of Line process (hereinafter referred to as "FEOL process") is completed, to select transistors 120 and 160. Hereinafter, the term "FEOL-end chip" or "FEOL-end semiconductor device" may mean a chip or semiconductor device of which the FEOL process is completed.

The selection logic 110 selects one of the transistors 120 according to an input signal provided through pads P1, P2, and P3. The selection logic 110, for example, may be a decoder formed of logic gates. The selection logic 110 may be implemented by removing vias and metal lines formed at an upper layer a substrate and forming vias and metal lines newly, in a FEOL-end semiconductor device. Accordingly, after the FEOL process, a process for removing some vias and metal layers and a mask for forming vias and metal lines may be done.

That is, after a FEOL-end semiconductor device is completed, separate vias and metal lines for test and the pads P1 to P3 for signal input are formed. The selection logic 110 for selecting one of the transistors 120 may be implemented if the selection logic 110 is connected with gates of a plurality of, for example, m transistors to be tested.

The selection logic 110 may be implemented according to various methods. For example, various standard cells or modified filler cells (e.g., a logic filler cell) existing on a FEOL-end chip, logic cells or transistors previously provided at a design step for specific purpose, or decoder IPs (intellectual Properties) previously formed at a free area of a chip may be used. A tester (or test equipment) (not shown) may sequentially select the transistors 120 through the selection logic 110 one by one and measure an electrical characteristic of a selected transistor such as a DC characteristic.

The transistors 120 are test target elements and may be referred to as a device under test (hereinafter referred to as "DUT") from which electrical characteristics are detected. One of the transistors 120 is selected by the selection logic 110. A selection signal may be provided to a gate of a transistor from the selection logic 110. If the selected transistor is turned on, a channel may be formed between a common drain 130 and a common source 135. The tester may measure an electrical characteristic of the selected transistor when connected with pads P4 and P5 through probing needles of a probe card. Here, gates of the transistors 120 may be connected to the selection logic 110 through separate gate lines. In the event that four transistors exist, gates of the four transistors may be connected to the selection logic 110 through four gate lines.

Drains of transistors may be electrically connected through contacts to form a common drain 130. The common drain 130 is connected with a pad P4. Sources of transistors are electrically connected through contacts to form a common source 135. The common source 135 is connected with a pad P5. The common terminals 130 and 135 are used as a drain and a source of a transistor selected by the selection logic 110. In FIG. 1, each transistor may be measured through the common terminals 130 and 135. However, example embodiment are not limited thereto. For example, measurement may be made according to various methods without connecting sources and drains of transistors.

A selection signal from the test is provided to the pads P1 to P3. For example, if a 3-bit selection signal is provided through the pads P1 to P3, the selection logic 110 may select one of 8 ($2^3$) transistors. Here, the number of pads is a non-limiting example. The number of pads and a decoding size of the selection logic 110 may be changed according to the number of transistors 120. The pads P4 and P5 are electrically connected to the common drain and source 130 and 135, respectively. A DC characteristic of a selected transistor may be measured through a voltage or a measurement current applied to the pads P4 and P5.

Functions of the selection logic 150, the transistors 160, common terminals 170 and 175, and pads P6 to P10 are substantially the same as those of the selection 110, the transistors 120, the common terminals 130 and 135, and the pads P1 to P5. Likewise, it may be apparent that the number of the pads P6 to P8 and the number of gate lines are changed according to the number of the transistors 160.

In example embodiments, the semiconductor device 100 may select one of a plurality of transistors through the selection logic 110/150 formed at a FEOL-end chip, thereby monitoring the huge number of elements and improving probability of detecting deterioration or defect caused at a manufacturing level. The semiconductor device for test 100 may make it possible to improve error or detect caused at each manufacturing step. In other words, it may be possible to improve yield markedly.

Figure 2A:
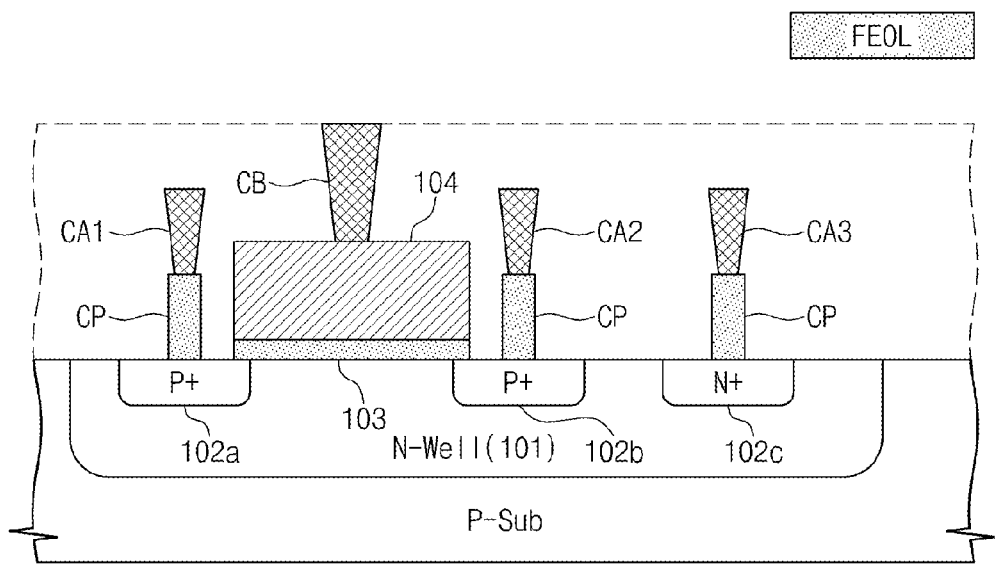
FIGS. 2A and 2B are cross-sectional views of a semiconductor device for test according to example embodiments of inventive concepts.
Figure 2B:
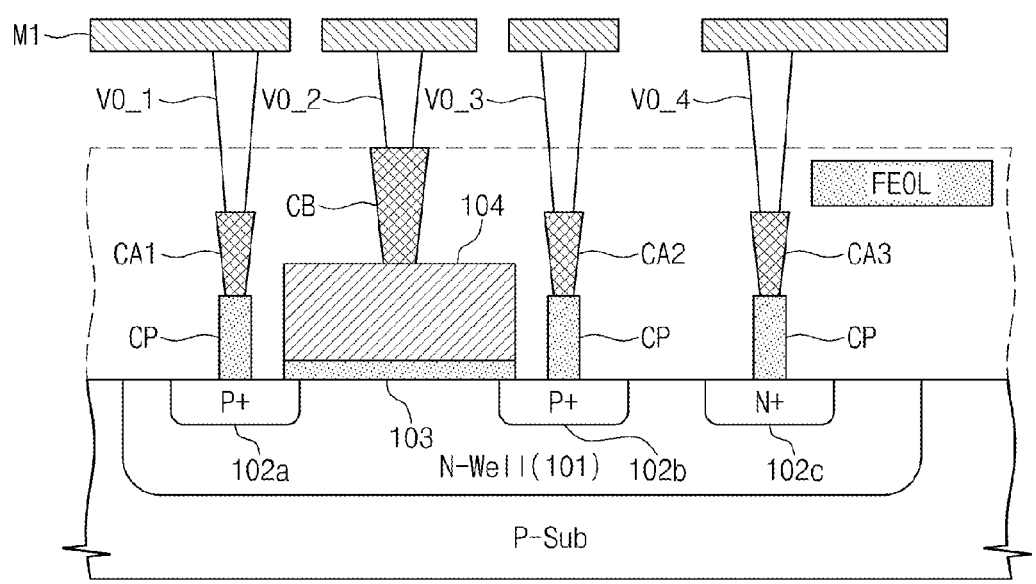

FIGS. 2A and 2B are cross-sectional views of a semiconductor device for test according to example embodiments of inventive concepts. FIG. 2A is a cross-sectional view of a semiconductor device formed by a FEOL process. FIG. 2B is a cross-sectional view of a semiconductor device for test according to example embodiments of inventive concepts.

Referring to FIG. 2A, fundamental elements of a semiconductor device are formed at a FEOL process. For example, at the FEOL process, wells, sources, drains, etc. may be formed by injecting dopants. Also, insulation layers, gates, etc. may be formed at the FEOL process. In general, fundamental elements of a semiconductor device such as transistors may be formed through the FEOL process.

For example, PMOS transistors of a semiconductor device 100 are formed at an N-well 101 that is formed on a p-type substrate P-Sub through the FEOL process. P+ doping regions 102a and 102b for one ends (drains or sources) of PMOS transistors and N+ doping regions 102c for body bias are formed at the N-well 101. An insulation layer 103 is formed on a channel. A gate electrode 104 that is conductive is formed on the insulation layer 103. A contact CB for connection with a metal line or a via is formed on the gate electrode 104. Contact plugs CP are formed on the doping regions 102a, 102b, and 102c, respectively. Contacts CA1, CA2, and CA3 for connection with metal lines or vias are formed on the contact plugs CP, respectively. In addition, it may be understood vias and metal lines are further formed through the FEOL process.

If elements are formed through the above-described FEOL process, then there is performed a Back End Of Line process (hereinafter referred to as "BEOL process") corresponding to an interconnection process for electrically connecting elements. However, in example embodiments of inventive concepts, after the FEOL process is completed, vias and metal lines that are formed to perform functions of a semiconductor device may be removed to provide a test chip. Afterwards, vias V0 and a metal layer M1 are additionally formed to form a semiconductor device for test 100 according to example embodiments of inventive concepts.

FIG. 2B illustrates a cross section of a semiconductor device for test according to example embodiments of inventive concepts. In particular, there is illustrated an example where selection logic 110 (refer to FIG. 1) is formed at a FEOL-end semiconductor device. Referring to FIG. 2B, a semiconductor device may be manufactured through a FEOL process. Next, in example embodiments of inventive concepts, a mask may be use to form separate vias and metal line(s).

A mask for forming vias V0_1, V0_2, V0_3, and V0_4 and a metal line M1 may be provided over semiconductor devices manufactured through a FEOL process. Afterwards, selection logics 110 and 150 according to example embodiments of inventive concepts may be implemented using the vias V0_1, V0_2, V0_3, and V0_4 and the metal line M1. The selection logics 110 and 150 may be connected with gates of transistors 120 and 160 to be tested, using the mask.

There is described a method for manufacturing a semiconductor device for test 100 using a FEOL-end semiconductor device. In the semiconductor device for test 100, after the FEOL process, the selection logics 110 and 150 and the transistors 120 and 160 to be tested are connected through minimum routing using vias and contacts. Each of the selection logics 110 and 150 may sequentially select transistors to be tested one by one in response to an input selection signal.

Figure 3:
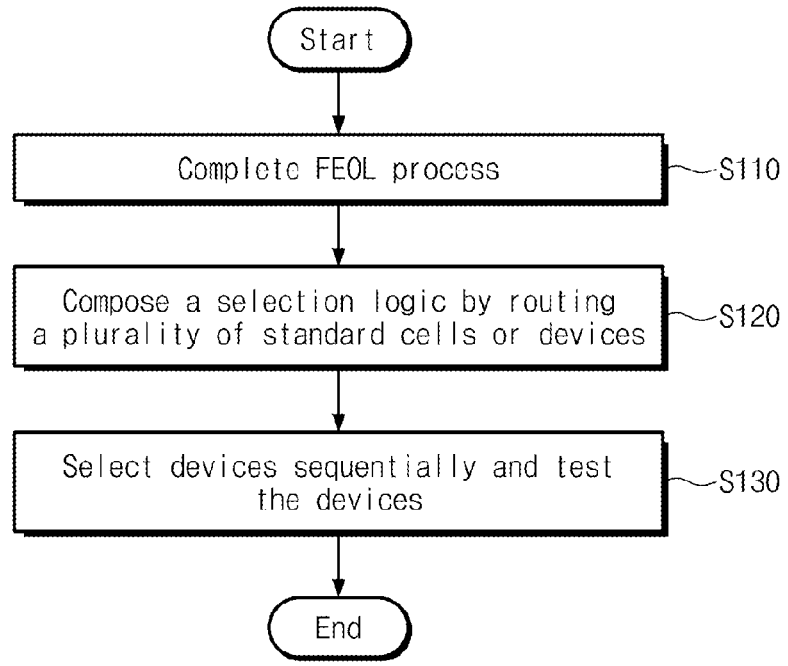
FIG. 3 is a flow chart schematically illustrating a method for making a semiconductor device for test according to example embodiments of inventive concepts.

FIG. 3 is a flow chart schematically illustrating a method for making a semiconductor device for test according to example embodiments of inventive concepts. Referring to FIG. 3, a semiconductor device for test 100 is formed using conductive lines and vias in minimum with respect to a FEOL-end chip that includes manufactured elements. That is, selection logics 110 and 150 for selecting a plurality of transistors are formed using a simple routing process.

In operation S110, a FEOL process about a semiconductor device is performed. Elements and contacts of the semiconductor device are formed through the FEOL process. In this step, various elements for forming the selection logics 110 and 150 may be previously manufacture. In this case, it may be apparent that a preliminary design step for forming the selection logics 110 and 150 separately exists. At this time, assignment of a chip area and a layout for circuit formation for synthesizing the selection logics 110 and 150 may be considered. That is, arrangement about various elements or standard cells for adding the selection logics 110 and 150 may be considered from a design step. However, a method according to example embodiments of inventive concepts has an advantageous in that a layout for synthesizing separate selection logics 110 and 150 is not considered at the design step of the semiconductor device. That is, the selection logics 110 and 150 may be formed using various elements, standard logic cells, or IPs, or decoder circuits that are previously formed at the semiconductor device, after the FEOL process.

In operation S120, the selection logics 110 and 150 are synthesized. In the event that separate standard cells or elements or decoder circuits for the selection logics 110 and 150 are previously prepared at the design step, the selection logics 110 and 150 may be formed by making vias or metal lines. Routing with transistors 120 and 160 to be tested and pads are formed in this step. Even though a separate design step for the selection logics 110 and 150 does not exist before the FEOL process, the selection logics 110 and 150 may be formed using previously formed elements or standard cells and decoder circuits. That is, the selection logics 110 and 150 may be designed and formed after the FEOL process. Here, it may be apparent that a process for removing vias or metal lines existing on an upper layer portion after the FEOL process is included to form the selection logics 110 and 150.

In operation S130, a tester (or test equipment) tests the semiconductor device for test 100. That is, a selection signal is provided to the selection logic 110 through pads P1, P2, and P3 to select one of the transistors 120. The tester detects an electrical characteristic of the selected transistor through pads P4 and P5.

As described above, the semiconductor device for test 100 according to example embodiments of inventive concepts includes at least one selection logics 110 and 150 that is formed after the FEOL process. Accordingly, even though the small number of pads for providing a selection signal to be applied to the selection logics 110 and 150 is formed, it is possible to select a plurality of transistors, thereby markedly increasing the number of transistors to be tested per area. According to the semiconductor device of test 100 and a test method thereof, it is possible to monitor defects generated during a manufacturing process more exactly. In other words, even though a new manufacturing process is used, it is possible to increase yield within a short term.

Figure 4:
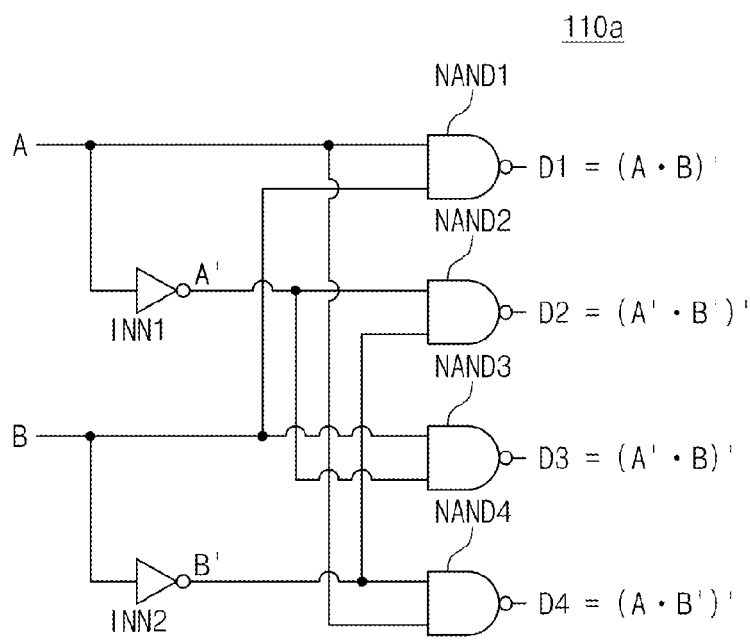
FIG. 4 is a circuit diagram schematically illustrating a selection circuit 110 of FIG. 1, according to example embodiments of inventive concepts.

FIG. 4 is a circuit diagram schematically illustrating a selection circuit 110 of FIG. 1, according to example embodiments of inventive concepts. Referring to FIG. 4, a selection circuit 110 may be implemented with, for example, a decoder 110a.

The decoder 110a activates one of four output signals D1, D2, D3, and D4 in response to two selection signals A and B. For example, the decoder 110a may be a 2-by-4 decoder. However, the example embodiment are not limited thereto. For example, the decoder 110a may be variously changed to have an enable input or to have an input/output structure such as 3-by-8, 4-by-16, 5-by-32, etc. In general, standard logic cells of a semiconductor device may include a plurality of inverters and a plurality of NAND gates. A decoder for selecting more transistors within a restricted chip area can be formed by using such inverters and NAND gates.

The following table 1 illustrates a truth table of the decoder.

TABLE 1

| A | B | D1 (A' + B') | D2 (A + B) | D3 (A + B') | D4 (A' + B) |
|---|---|---|---|---|---|
| 0 | 0 | 1 | 0 | 1 | 1 |
| 0 | 1 | 1 | 1 | 0 | 1 |
| 1 | 0 | 1 | 1 | 1 | 0 |
| 1 | 1 | 0 | 1 | 1 | 1 |

One of the output signals D1 to D4 has a logical value of "0" according to logical values of selection signals A and B. A PMOS transistor is selected by the output signals D1 to D4 each having a gate voltage corresponding to such a logical value. A configuration on the decoder 110a may be variously changed. Inverters may be added to inputs of the selection signals A and B or outputs of the output signals D1 to D4 to select NMOS transistors. In this case, logical values of the output signals D1 to D4 may be inverted.

Figure 5:
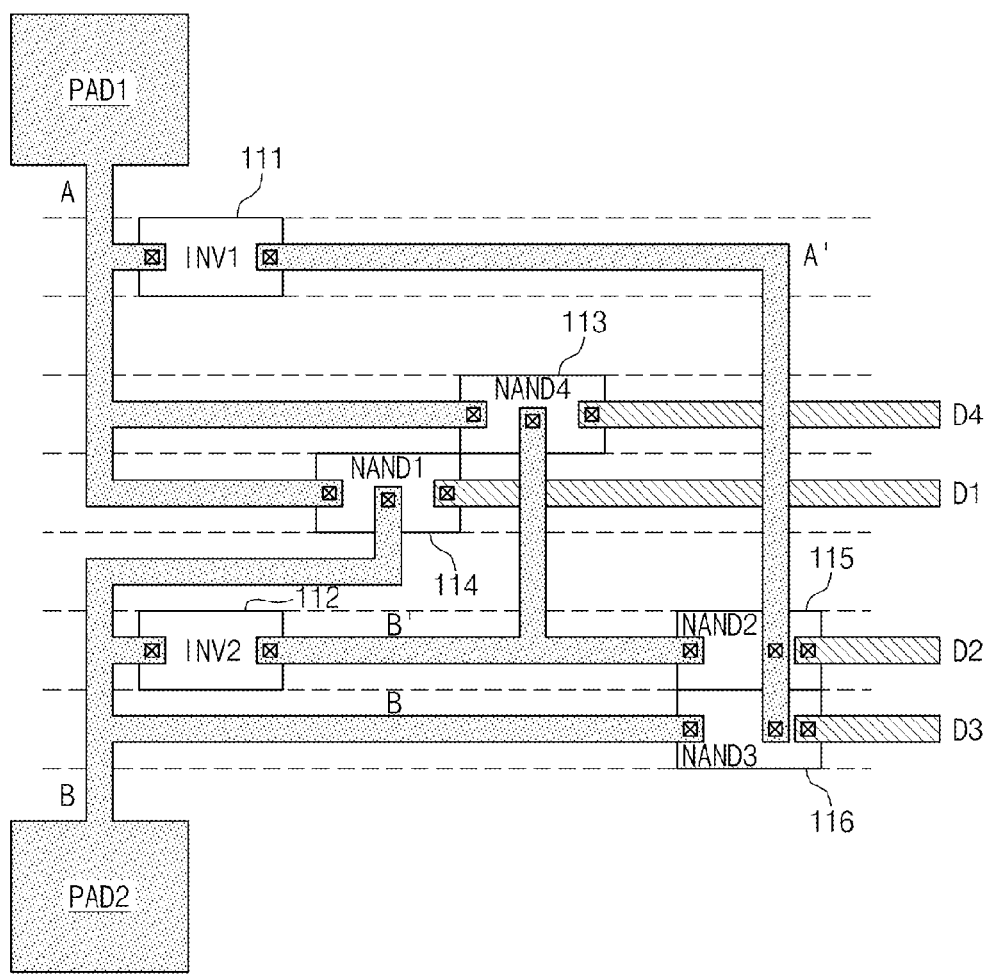
FIG. 5 is a plan view of a layout structure for a decoder having a logic function of FIG. 4.

FIG. 5 is a plan view of a layout structure for a decoder having a logic function of FIG. 4. Referring to FIG. 5, a decoder 110a includes pads PAD1 and PAD2 for receiving selection signals, inverters 111 and 112, NAND gates 113, 114, 115, and 116.

The inverter 111 may be formed by synthesizing standard cells used to form a semiconductor device for test 100, logic filler cells, or a plurality of elements. Here, for the sake of description, it is assumed that a standard logic cell is reused as the inverter 111. A first selection signal A input through the pad PAD1 is provided to an input terminal of the inverter 111. The pad PAD1 and the inverter 111 are connected through a contact. An output of the inverter 111 is transferred to input terminals of NAND gates 115 and 116.

The inverter 112 corresponds to an inverter INV2 of FIG. 4. The inverter 112 is connected with the pad PAD2 through a conductive line and receives a second selection signal B through the pad PAD2. An output of the inverter 112 is provided to input terminals of the NAND gates 113 and 115. In the event that the inverter 112 is implemented with a standard logic cell, as illustrated, one placed at a cell row different from the inverter 111 or one included in the same cell row as the inverter 111 may be selected.

The NAND gate 113 corresponds to a NAND gate NAND4 of FIG. 3 and receives selection signals A and B'. The NAND gate 113 logically combines the selection signals A and B' to output an output signal D4. The output signal D4 may be provided to one of gates of transistors. The NAND gate 114 corresponds to a NAND gate NAND1 of FIG. 3 and receives selection signals A and B. The NAND gate 114 logically combines the selection signals A and B to output an output signal D1. The NAND gate 115 corresponds to a NAND gate NAND2 of FIG. 3 and receives selection signals A' and B'. The NAND gate 115 logically combines the selection signals A' and B' to output an output signal D2. The NAND gate 116 corresponds to a NAND gate NAND3 of FIG. 3 and receives selection signals A' and B. The NAND gate 116 logically combines the selection signals A' and B to output an output signal D3.

An example has been described for selection of logic cells for forming a simple decoder circuit and routing between selected logic cells. However, it may be apparent that locations of logic cells selected to form the decoder 110a or selection of conductive lines for electric connection is variously changed.

Figure 6A:
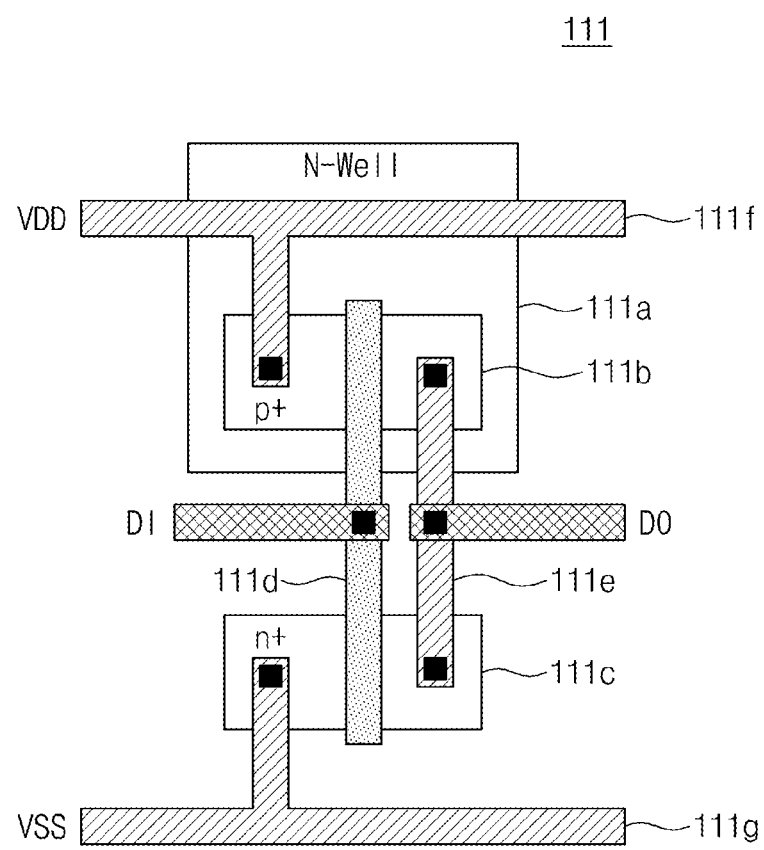
FIGS. 6A and 6B are diagrams schematically illustrating layouts of an inverter 111 and a NAND gate implemented with a standard cell.
Figure 6B:
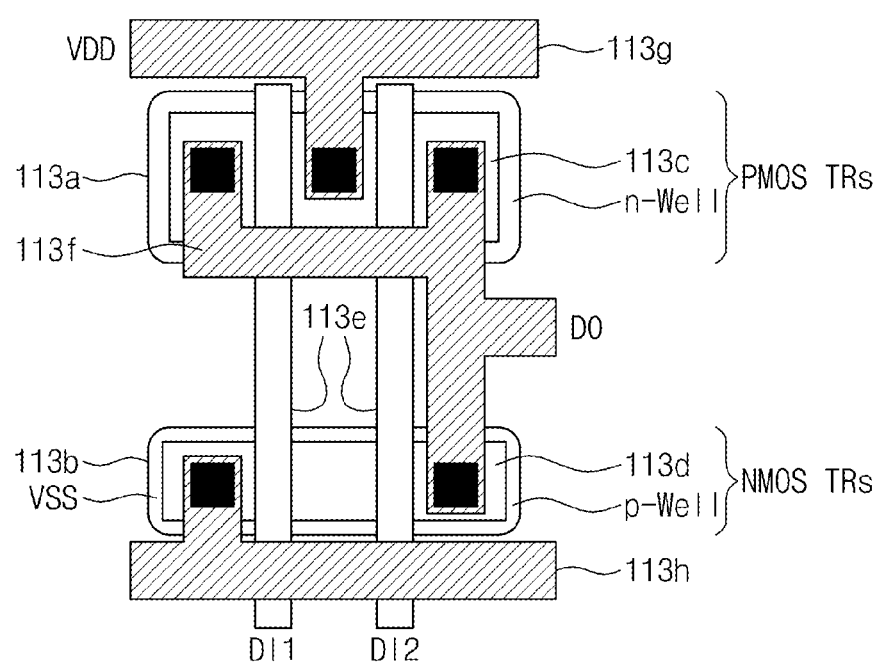

FIGS. 6A and 6B are diagrams schematically illustrating layouts of an inverter 111 and a NAND gate 113 implemented with a standard cell. Referring to FIGS. 6A and 6B, an inverter 111 and a NAND gate 113 may be implemented with a standard logic cell of a semiconductor device 100.

The inverter 111 may correspond to a logic cell for forming a decoder according to example embodiments of inventive concepts. The inverter 111 is formed using a complementary MOS (hereinafter referred to as "CMOS") transistor. That is, a driving voltage VDD may be provided to a source of a PMOS transistor through line 111f, and a ground voltage VSS is provided to a source of an NMOS transistor. A drain of the PMOS transistor and a drain of the NMOS transistor are connected to a conductive line 111e to form an output terminal DO. Gates (hereinafter referred to as "common gate") of the PMOS and NMOS transistors are connected to an input terminal DI of the inverter 111.

The inverter 111 is formed of a PMOS transistor formed at an N-well 111a and an NMOS transistor formed at a P-type substrate. A P+ doping region 111b for the PMOS transistor is provided on the N-well 111a. An N+ doping region 111c for the NMOS transistor is formed at the P-type substrate. Source-to-drain channels of the PMOS and NMOS transistors are controlled by the common gate 111d. The sources of the PMOS and NMOS transistors are connected through a power line for transferring the driving voltage VDD or the ground voltage VSS and a contact plug. The common gate 111d is connected to the input signal line DI for receiving an input signal through a contact plug. The drains of the PMOS and NMOS transistors are connected to a conductive line to form the output terminal DO. The layout of the inverter 111 is a non-limiting example. It may be apparent that the inverter 111 is be formed according to various layout manners.

FIG. 6B is a diagram schematically illustrating a layout of a NAND gate 113 of FIG. 5. Referring to FIG. 6B, a NAND gate 113 is implemented with a standard cell like an inverter.

The NAND gate 113 is formed of CMOS transistors. That is, a driving voltage VDD is provided to a source of a PMOS transistor, and a ground voltage VSS is provided to a source of an NMOS transistor. The NAND gate 113 is formed of PMOS transistors formed at an N-well 113a and an NMOS transistor formed at a P-well 113b. A P+ doping region 113c for the PMOS transistor is provided on the N-well 113a. A common source and two drains are formed at the P+ doping region 113c by conductive lines DI1 and DI2 to which two input signals are provided. Sources (hereinafter referred to as "common source") of the PMOS transistors is connected to a power line 113g to which a power supply voltage VDD is provided. An output terminal DO is pulled up to the power supply voltage VDD if one of the two conductive lines DI1 and DI2 is activated.

An N+ doping region 113d for an NMOS transistor is formed at a P-type substrate or a P-well 113b. Example embodiments of inventive concepts i may include the N+ doping region 113d formed at the P-well 113b. Sources and drains of NMOS transistors are switched by the conductive lines DI1 and DI2 to which two input signals are provided. Accordingly, when two input signals all remain at a high level, a power line 113h provided with a ground voltage VSS is connected with an output terminal DO.

Layouts of an inverter 111 and a 2-input NAND gate 113 implemented with a standard cell are described. However, the example embodiments are not limited thereto. The layouts may be variously changed according to the number of selection signals DI or a characteristic such as a design rule of a semiconductor device.

Figure 7:
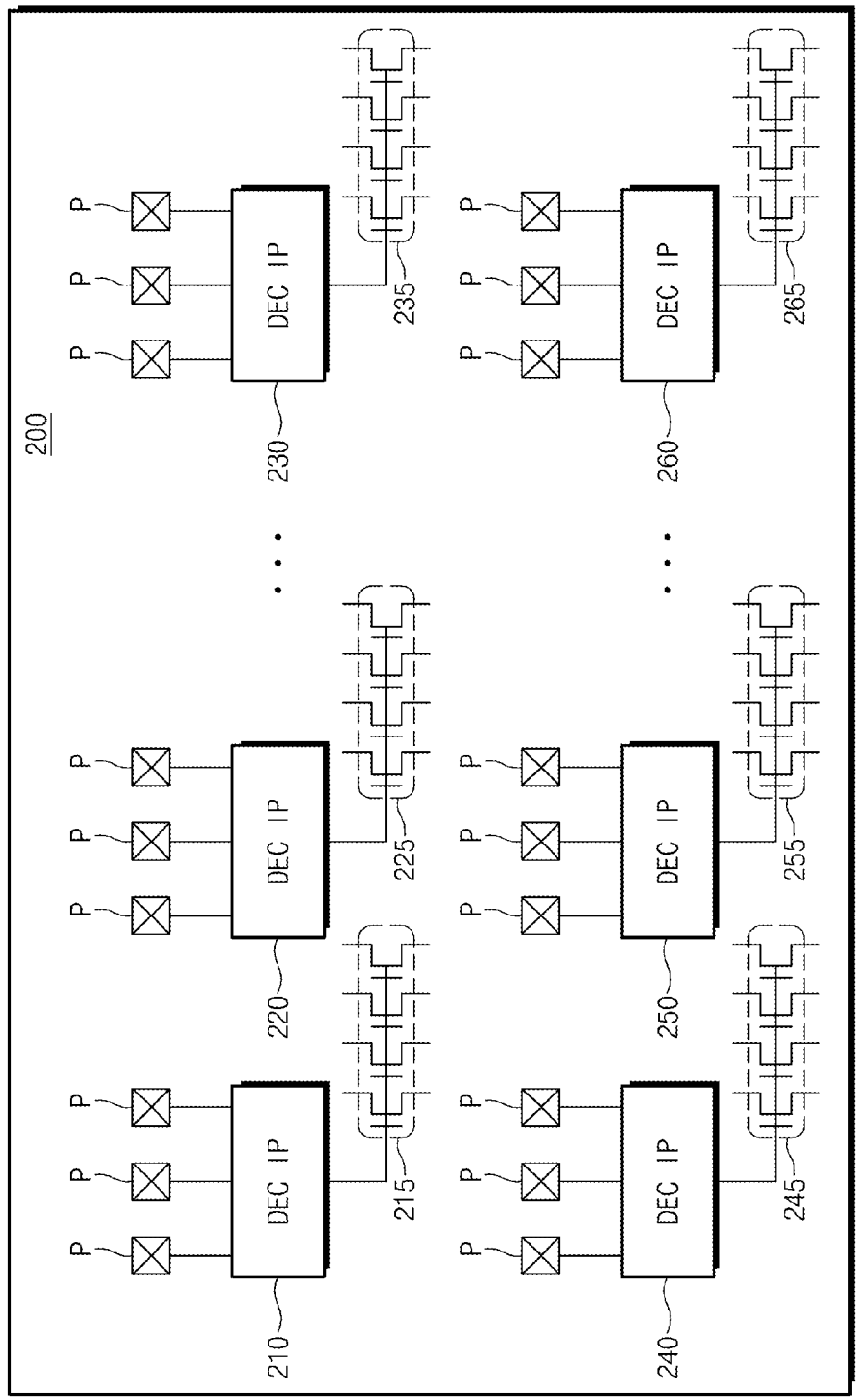
FIG. 7 is a block diagram schematically illustrating a semiconductor device for test according to example embodiments of inventive concepts.

FIG. 7 is a block diagram schematically illustrating a semiconductor device for test 100 according to example embodiments of inventive concepts. Referring to FIG. 7, a semiconductor device for test 200 includes decoder intellectual properties (hereinafter referred to as "IPs") that are previously formed for a test of a FEOL level. If the FEOL process is completed, a routing process may be performed to connect the decoder IPs and transistors to be tested.

The semiconductor device for test 200 may include a plurality of decoder IPs 210, 220, 230, 240, 250, and 260 that are formed to select transistors 215, 225, 235, 245, 255, and 265 at specific areas at a design level. That is, the decoder IPs 210, 220, 230, 240, 250, and 260 may be formed at a FEOL process. If routing is made through via and metal masks for forming the semiconductor device for test 200, the decoder IPs 210, 220, 230, 240, 250, and 260 may be connected with the transistors 215, 225, 235, 245, 255, and 265.

A routing process for connecting the decoder IPs 210, 220, 230, 240, 250, and 260 and the transistors 215, 225, 235, 245, 255, and 265 previously formed is applied to the semiconductor device for test 200 after the FEOL process. Accordingly, it is unnecessary to combine separate elements or cells for implementing a decoder.

Figure 8:
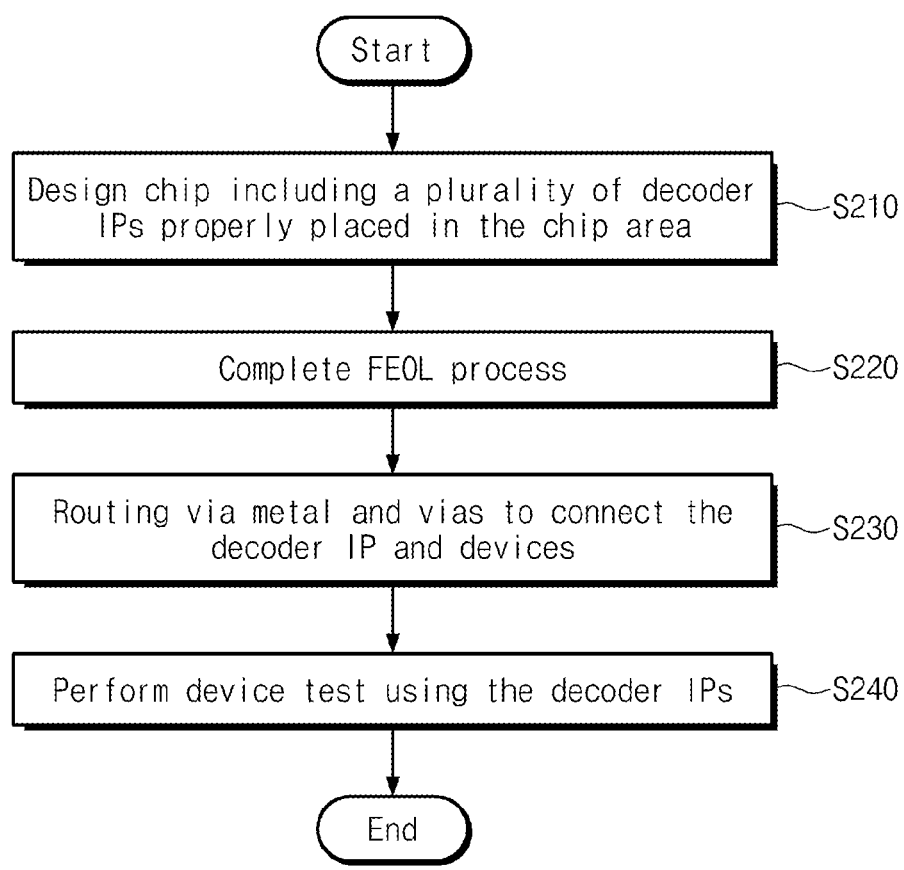
FIG. 8 is a flow chart schematically illustrating a test method of a semiconductor device for test of FIG. 7.

FIG. 8 is a flow chart schematically illustrating a test method of a semiconductor device for test 200 of FIG. 7. Referring to FIG. 8, decoder IPs for selecting transistors to be tested are disposed at a specific chip area at a design level. A semiconductor device for test may be implemented by connecting decoder IPs embedded for a test and transistors to be tested.

In operation S210, a semiconductor device for test 200 including decoder IPs 210, 220, 230, 240, 250, and 260 to be used for a test may be designed. At this time, the number of decoder IPs and the number of transistors to be selected by one decoder IP may be decided at a design level to increase (and/or maximize) the number of transistors to be measured. The semiconductor device for test 200 may be designed such that a distance between a decoder IP and transistors is reduced (and/or minimized).

In operation S220, a FEOL process is performed to form the semiconductor device for test 200. In this step, decoder IPs 210, 220, 230, 240, 250, and 260 and transistors are formed.

In operation S230, there is made routing about the semiconductor device for test 200 formed through the FEOL process. That is, some metal layers and vias formed through the FEOL process are removed, and routing is made to connect the decoder IPs 210, 220, 230, 240, 250, and 260 and the transistors. Pads to be connected with the decoder IPs 210, 220, 230, 240, 250, and 260 through the routing are formed, and a common drain/a common source of transistors is connected with pads for specification.

In operation S240, transistors 215, 225, 235, 245, 255, and 265 are tested. That is, a tester (or test equipment) inputs selection signal through pads connected with the decoder IPs 210, 220, 230, 240, 250, and 260. In this case, a gate signal of a transistor corresponding to the selection signal is activated, and the tester monitors an electrical characteristic of the activated transistor through a pad connected to a common source or a common drain. A test operation selected through one decoder IP is sequentially performed through remaining decoder IPs 210, 220, 230, 240, 250, and 260, thereby making it possible to select all transistors of the semiconductor device for test 200 to be monitored.

In example embodiments, a decoder for selecting a transistor to be tested may be implemented with an IP previously provided at the beginning of design. In this case, the number or locations of decoder IPs may be determined at a design level to test transistors in maximum.

Figure 9:
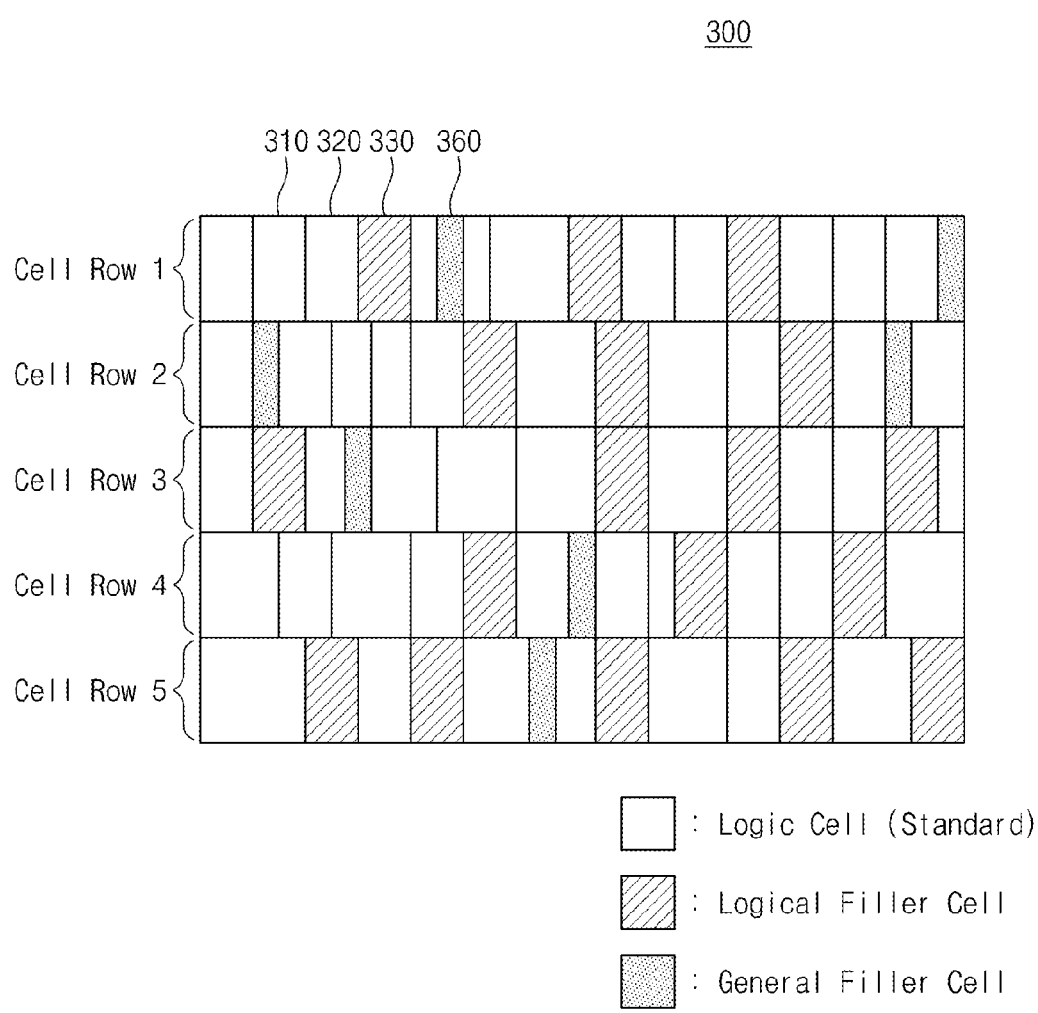
FIG. 9 is a diagram schematically illustrating a semiconductor device according to example embodiments of inventive concepts.

FIG. 9 is a diagram schematically illustrating a semiconductor device according to example embodiments of inventive concepts. Referring to FIG. 9, in example embodiments, a circuit block of a semiconductor device for test 300 may be divided into a plurality of rows that is formed on the basis of power rails. Each row may include a plurality of logic cells, logic filler cells, and general filler cells according to a function. Although not shown, each row may include one or more tap cells.

Each of logic cells 310 and 320 is a standard cell unit by which the semiconductor device 300 substantially operates. Each of the logic cells 310 and 320 has an input terminal and an output terminal. The logic cells 310 and 320 process signals provided to their input terminals and output a processed result through their output terminals. In addition, each of the logic cells 310 and 320 may have a power line. For example, a driving voltage VDD and a ground voltage VSS may be provided to the logic cells 310 and 320. Dividing of rows of cells illustrate may be associated with arrangement of power lines.

A logic filler cell 330 may be a cell placed to be adjacent to the logic cells 310 and 320. However, the logic filler cell 330 is not associated with various logic blocks that are driven at the semiconductor device for test 300. The logic filler cell 330 does not participate in a logical operation of the semiconductor device 300, but is used after a FEOL process to form a transistor at a test operation. The logic filler cell 330 for selecting a transistor at a test operation is formed at a dummy area, but it may be implemented the same as a standard cell. That is, the logic filler cell 330 may perform the same function as a general standard cell through routing.

A general filler cell 360 may be a dummy area that belongs to a row. The general filler cell 360 is used to fill a space between logic cells to level a process density in designing a layout of a circuit block. The general filler cell 360 is inserted between logic cells to maintain continuity of N-wells formed at logic cells. That is, the general filler cell 360 shares the logic cell 210 and an N-well. The general filler cell 360 shares the N-well with other logic cells adjacent in a row direction. The general filler cell 360 may enable most logic cells or logic filler cells in a first cell row of cells to share an N-well.

However, the general filler cell 360 does not participate in an operation of the semiconductor device for test 300. That is, the general filler cell 360 does not include active elements such as MOS transistors. Accordingly, a contact with a metal line for the general filler cell 360 is not used.

There is described arrangement and functions of the semiconductor device 300 where logic cells 310 and 320, logic filler cells 330, and general filler cells 360 are formed at one cell row. However, even though locations of logic cells, logic filler cells, and general filler cells formed at remaining cell rows are changed, they may be arranged to perform the same functions. Also, in example embodiments of inventive concepts, it is possible to easily implement the semiconductor device for test 300 according to existence of the logic filler cell 330.

Figure 10:
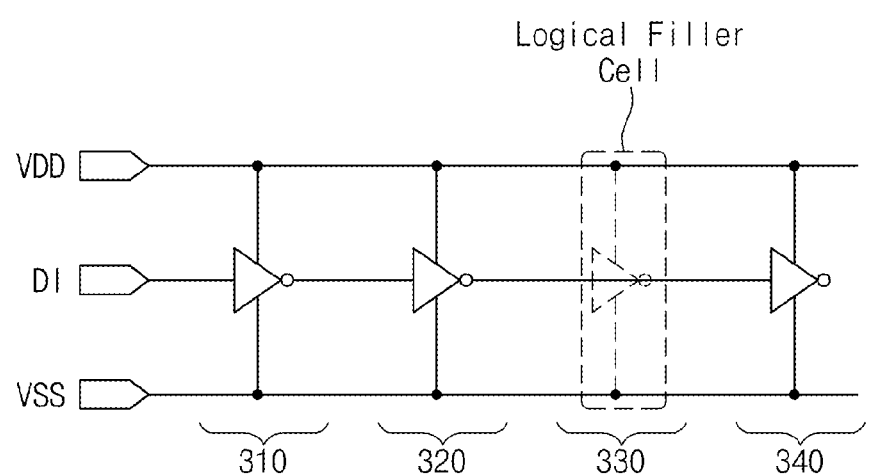
FIG. 10 is a circuit diagram schematically illustrating cells placed at one cell row of a semiconductor device of FIG. 9.

FIG. 10 is a circuit diagram schematically illustrating cells placed at one cell row of a semiconductor device of FIG. 9. Referring to FIG. 10, in example embodiments of inventive concepts, a logic filler cell 330 may be disposed between standard logic cells. There will be described the event that standard logic cells 310, 320, and 340 and a logic filler cell 330 are formed of inverters.

In example embodiments of inventive concepts, one cell row may be formed of the standard logic cells 310, 320, and 340 and the logic filler cell 330 occupying a space between the standard logic cells 310, 320, and 340. The standard logic cells 310, 320, and 340 provided in serial or in parallel between a driving voltage VDD and a ground voltage VSS may constitute a circuit such as a buffer or a ring oscillator. At this time, the logic filler cell 330 is not electrically connected. However, in case of a semiconductor device for test 300, the logic filler cell 330 may be used as an inverter for a decoder. Input and output terminals of the logic filler cell 330 may be connected with input and output terminals of gates for forming a decoder through metal lines and vias. This routing may enable the logic filler cell 330 to operate as a normal inverter only at a test process.

Figure 11:
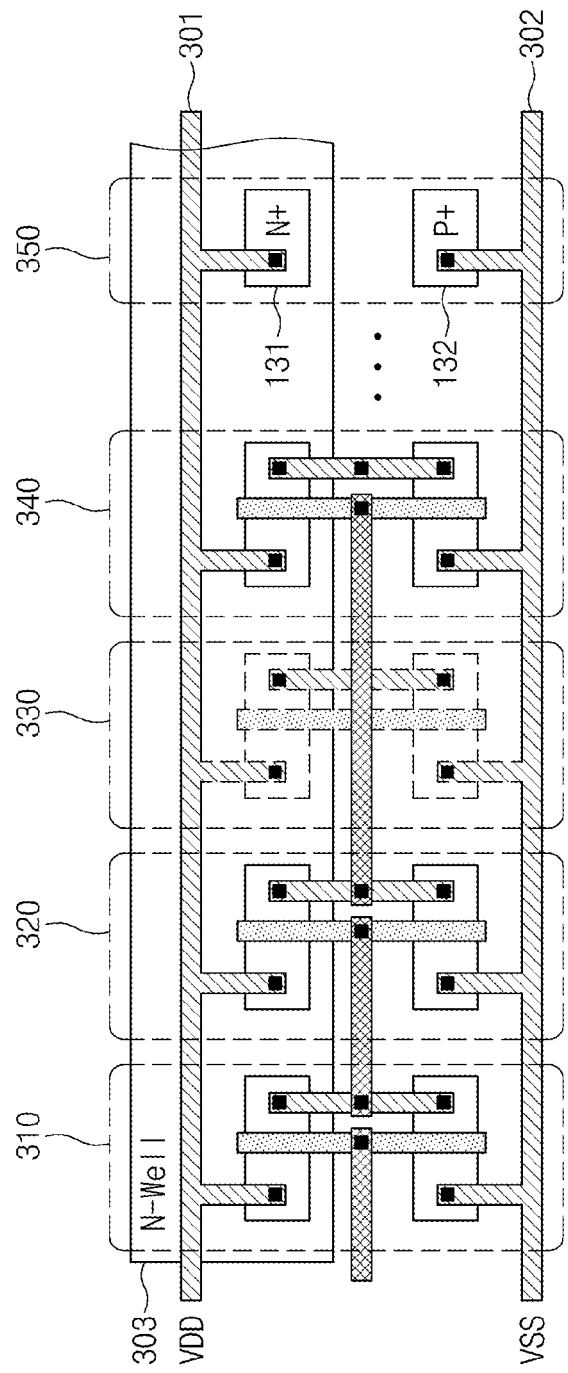
FIG. 11 is a diagram schematically illustrating a layout of a cell row of FIG. 10.

FIG. 11 is a diagram schematically illustrating a layout of a cell row of FIG. 10. Referring to FIG. 11, it is assumed that a circuit block according to example embodiments of inventive concepts includes a plurality of inverters 310, 320, and 340, a tap cell 350, and a logic filler cell 330. Here, a logic filler cell 330 is formed in the same structure as the inverters 310, 320, and 340. However, input and output terminals of the logic filler cell 330 are not connected through contacts even after a FEOL process is completed. Input and output terminals of the inverters 310, 320, and 340 provided as standard cells are interconnected through vias and conductive lines. However, no contacts are formed at gate lines as input and output terminals of the logic filler cell 330 or at its source and drains.

In the event that the semiconductor device for test 300 is formed, contacts are formed at input and output terminals of the logic filler cell 330. In contrast, conductive lines for forming input and output terminals of the inverters 310, 320, and 340 provided as standard cells are removed. After vias and conductive lines are removed, a decoder for selecting a transistor is formed through routing of the logic filler cell 330 or the standard cells 310, 320, and 340.

Figure 12:
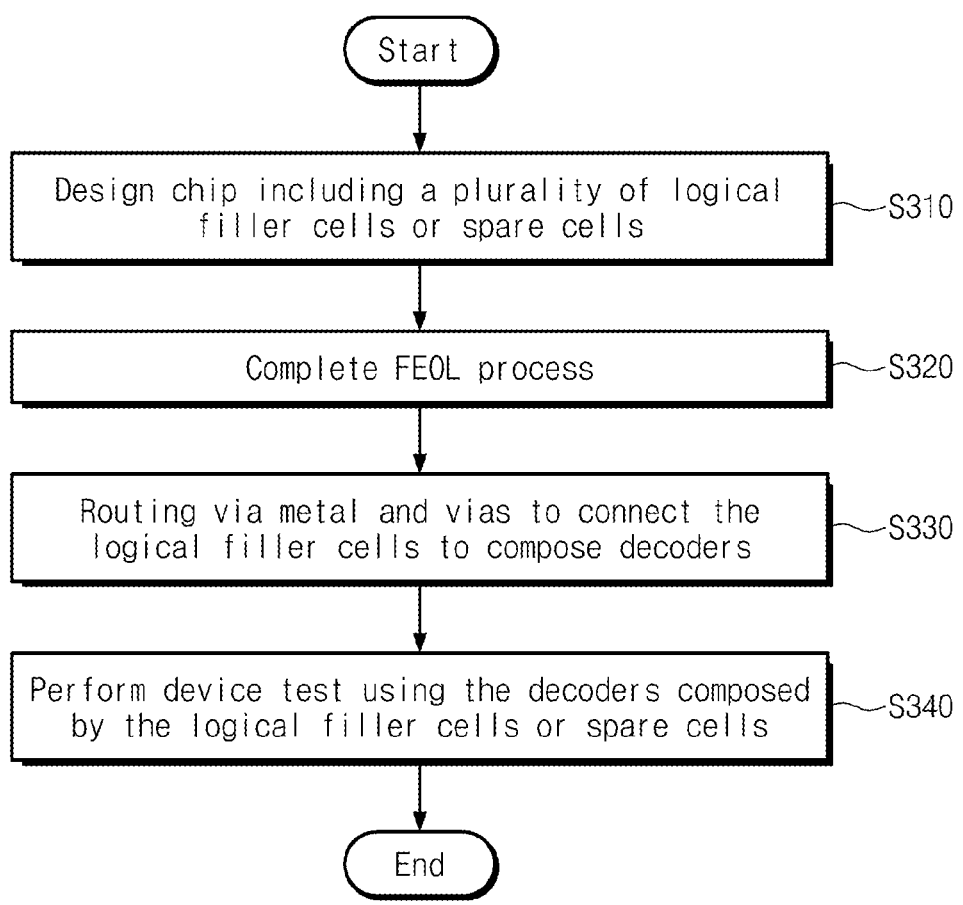
FIG. 12 is a flow chart schematically illustrating a test method of a semiconductor device for test including a logic filler cell, according to example embodiments of inventive concepts.

FIG. 12 is a flow chart schematically illustrating a test method of a semiconductor device for test including a logic filler cell, according to example embodiments of inventive concepts. Referring to FIG. 12, a semiconductor device according to example embodiments of inventive concepts includes logic filler cells capable of performing logical functions only through routing after a FEOL process.

In operation S310, logic filler cells that can perform logical functions by forming conductive lines and contacts after a FEOL process may be considered from a chip design level. Here, locations or the number of logic filler cells may be variously determined according to the number of transistors to be tested or the size of chip area to be tested. Here, the logic filler cells may be formed using various spare cells, which exist at a redundant area of a chip, and a filler cell.

In operation S320, a FEOL process of a semiconductor device 300 is performed to form elements and some contacts. Elements of the semiconductor device 300, contacts, and lower metal lines are formed through the FEOL process. Of course, logic filler cells or spare cells may be formed at the FEOL process.

In S330, there is made routing about the semiconductor device for test 300 provided by the FEOL process. That is, some metal layers and vias of a semiconductor device formed by the FEOL process are removed, and routing about logic filler cells or spare cells is made. A decoder according to example embodiments of inventive concepts may be formed through the routing about logic filler cells or spare cells. A pad for providing a selection signal and pads connected with source and drains of transistors are formed at a metal layer formed through the routing.

In operation S340, one of transistors is selected through the decoder formed using logic filler cells, and an electrical characteristic of the selected transistor is measured. That is, a tester (or test equipment) may input a selection signal to the decoder, formed of logic filler cells, through the pads. In this case, a gate signal of a transistor corresponding to the selection signal is activated, and the tester monitors an electrical characteristic of the activated transistor through a pad connected to a common source or a common drain. This test operation is iterated until all transistors formed at a semiconductor device for test are monitored.

As described above, according to example embodiments of inventive concepts, a decoder for selecting a transistor to be tested is formed using a logic filler cell that is formed for a specific purpose. Locations or the number of logic filler cells may be determined at a design level to test transistors in maximum. However, all filler cells may be designed to have a structure to be used as a logic gate after routing, at a design level.

Figure 13:
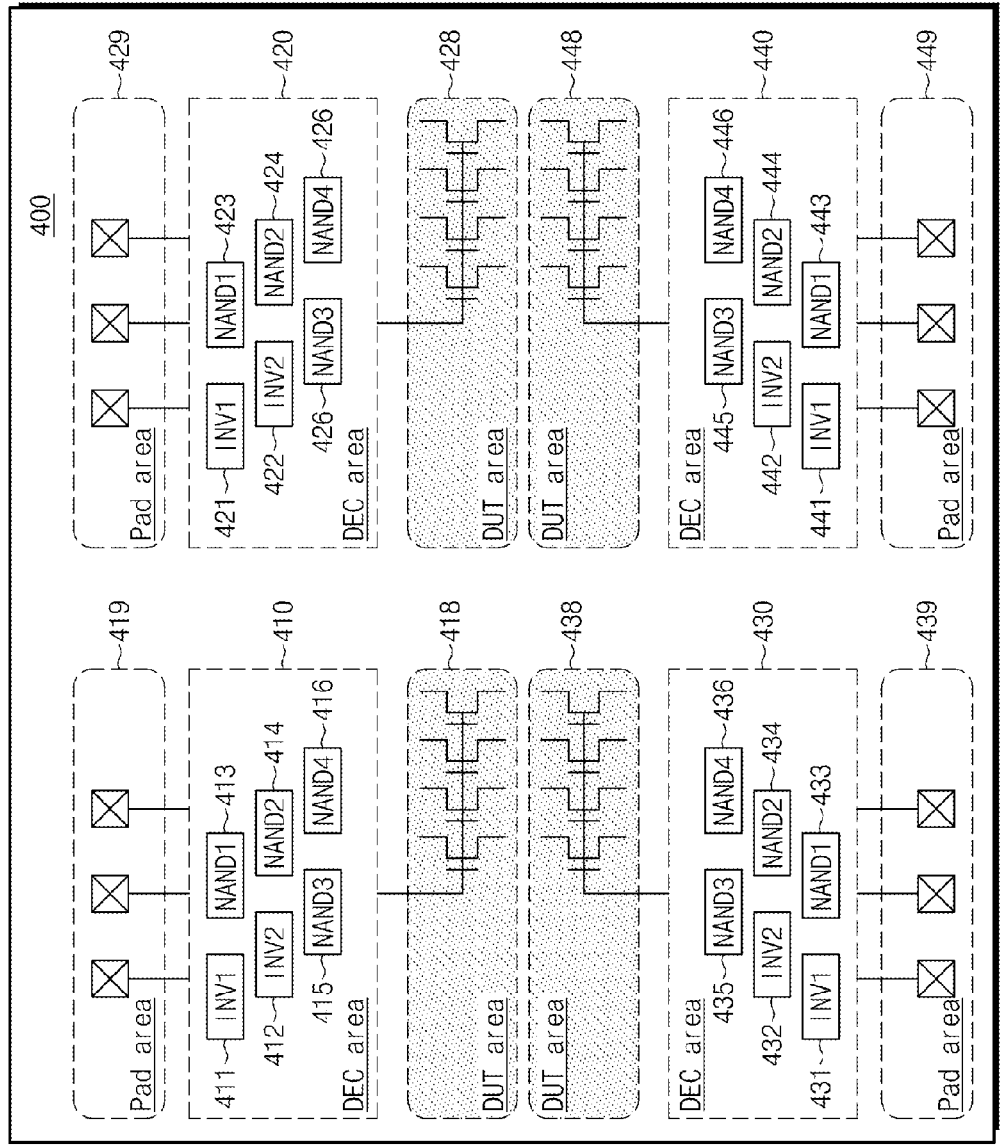
FIG. 13 is a block diagram schematically illustrating a semiconductor device for test according to example embodiments of inventive concepts.

FIG. 13 is a block diagram schematically illustrating a semiconductor device for test according to example embodiments of inventive concepts. Referring to FIG. 13, a semiconductor device 400 includes transistors 418, 428, 438, and 448 that are selected for a test at designing. Decoder areas 410, 420, 430, and 440 where decoders for sequentially selecting the transistors 418, 428, 438, and 448 are formed are determined. Also, there are formed pad areas 419, 429, 439, and 449 for providing selection signals to decoder circuits formed at the decoder areas 410, 420, 430, and 440.

Standard cells for forming a decoder or the above-described logic filler cells or spare cells are formed at each of the decoder areas 410, 420, 430, and 440. Here, it is assumed that cells included in the decoder areas 410, 420, 430, and 440 are standard cells. The decoder area 410 includes a plurality of logic cells 411 to 416. For example, the logic cells 411 to 416 may operate as a decoder after routing for test after a FEOL process is completed. Logic cells (e.g., 421 to 426, 431 to 436, and/or 441 to 446) placed at remaining decoder areas 420, 430, and 440 may be arranged the same as or differently from logic cells included in the decoder area 410.

Locations and sizes of the decoder areas 410, 420, 430, and 440, the test target areas 418, 128, 438, and 448, and the pad areas 419, 429, 439, and 449 may be determined to reduced (and/or minimize) lengths of conductive lines needed to form a decoder. That is, to improve accuracy of a test operation, a layout of a semiconductor device may be determined to form a decoder for improving accuracy of a test operation or to reduced (and/or minimize) a distance between transistors to be tested and the decoder or a distance between a pad and the decoder. Alternatively, logic cells constituting a decoder may be adjusted at a layout level such that they include large sizes of elements.

Figure 14:
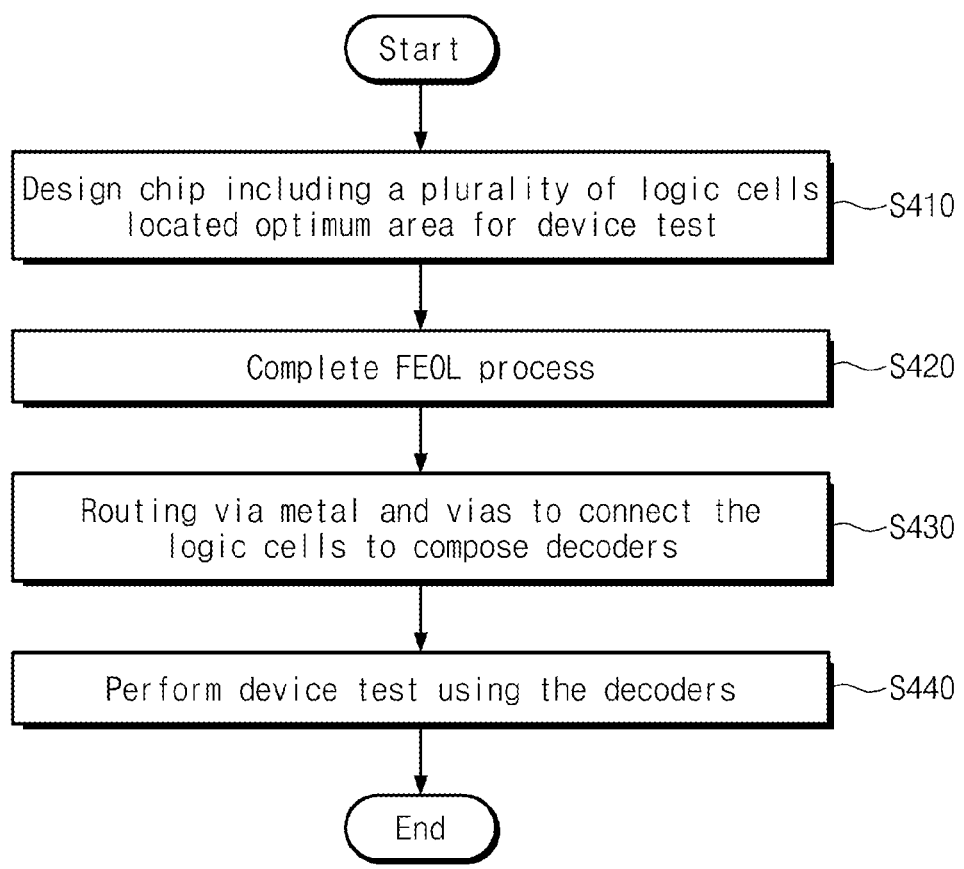
FIG. 14 is a flow chart schematically illustrating a device test method using a semiconductor device for test 400 of FIG. 13.

FIG. 14 is a flow chart schematically illustrating a device test method using a semiconductor device for test 400 of FIG. 13. Referring to FIG. 14, a decoding unit for forming a decoder for test is decided at designing. The decoding unit means a decoder, transistors to be tested, and pads for measuring a decoder and transistors. Logic cells or pads for forming each decoding unit or test target transistors are selected. If a FEOL process is completed, a decoder and pads are formed to have a circuit structure decided in designing.

In operation S410, the decoding unit is considered from a design level of a semiconductor device. The decoding unit is decided, and logic cells for forming a decoder are assigned every decoding unit. For example, logic cells 411 to 416 and a pad area 419 are assigned to form a decoder for measuring a device area 418 for test with optimized performance. Of course, logic cells and a pad area may be assigned with respect to respective decoding units.

In operation S420, a FEOL process of a semiconductor device 400 is performed to form elements, contacts, and various IPs of the semiconductor device 400. Elements, contacts, and lower metal lines of the semiconductor device 400 are formed through the FEOL process. Of course, logic filler cells corresponding to decoding units may be formed at the FEOL process. In addition, transistors to be tested may be formed at this step.

In S430, there is made routing about the semiconductor device 400 provided by the FEOL process. That is, some metal layers and vias of a semiconductor device formed by the FEOL process are removed, and routing about logic cells is made. Then, pads corresponding to the decoding units are formed, and a decoder for receiving a selection signal through a pad is formed. Gates of transistors selected by the decoder are connected with the decoder.

In operation S440, one of transistors selected through the decoder formed at each decoding unit. If receiving a selection signal through a pad from a tester (or test equipment), the decoder selects one transistor corresponding to the selection signal. Then, an electrical characteristic of the selected transistor is measured by the tester. This test operation is iterated until all transistors connected to the decoder are sensed.

There is described a method for setting a decoding unit to have an optimized test condition. The number and locations of logic cells for forming a decoder and the number of test target elements to be selected by one decoder may be decided according to various purposes at a design level. For example, a decoding unit for testing transistors as possible as many, a pad unit, and sorts of logic cells may be selected. Also, it may be apparent that a decoding unit is decided based on a sort of logic forming a decoder, a sort of metal line, etc., to sense transistors with possible high accuracy.

Figure 15:
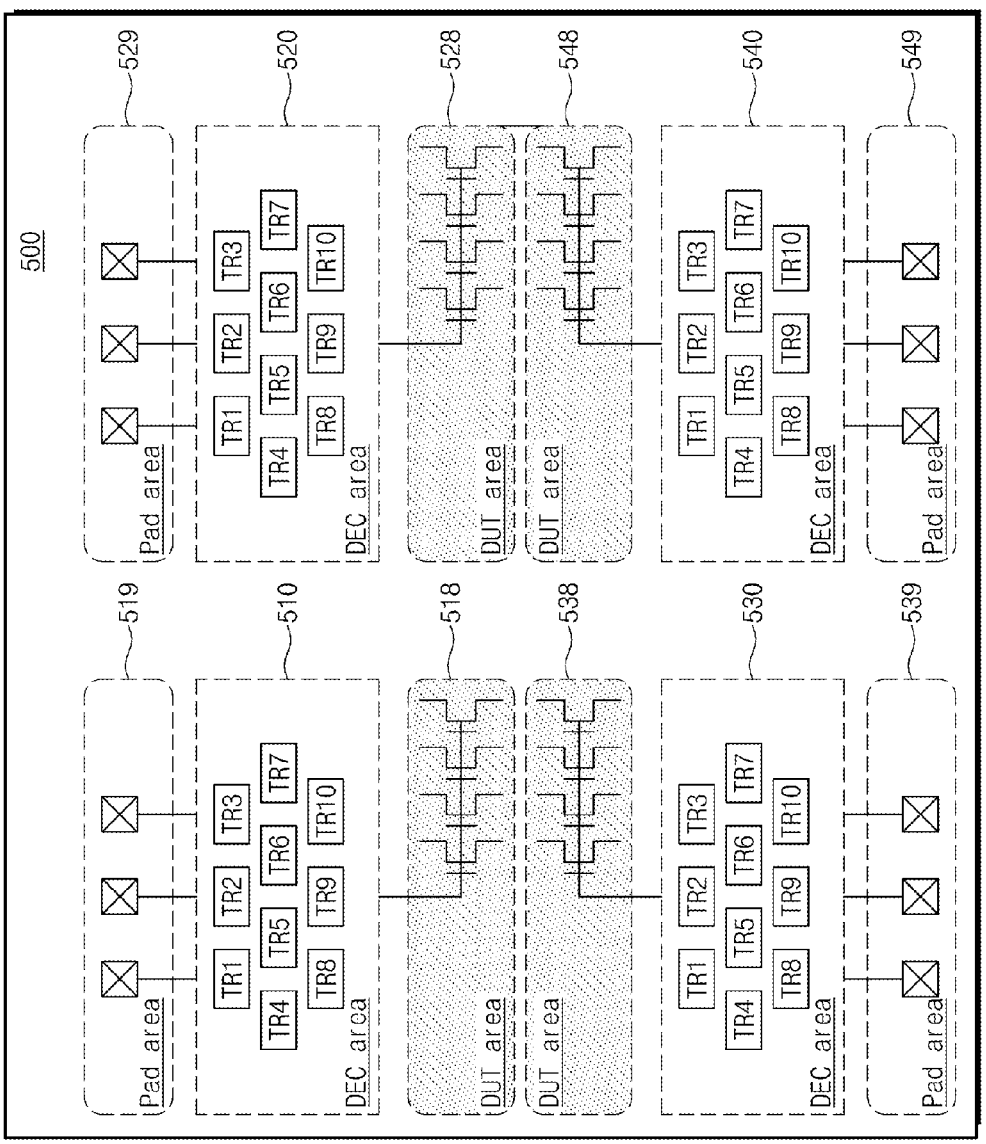
FIG. 15 is a block diagram schematically illustrating a semiconductor device for test according to example embodiments of inventive concepts.

FIG. 15 is a block diagram schematically illustrating a semiconductor device for test according to example embodiments of inventive concepts. Referring to FIG. 15, a semiconductor device 500 includes transistors 518, 528, 538, and 548 that are selected for a test at designing. Decoder areas 510, 520, 530, and 540 where decoders for sequentially selecting the transistors 518, 528, 538, and 548 are formed are determined. Also, there are formed pad areas 519, 529, 539, and 549 for providing selection signals to decoder circuits formed at the decoder areas 510, 520, 530, and 540.

Transistors TR1 to TR10 for forming a decoder are formed at each of the decoder areas 510, 520, 530, and 540. Here, the transistors TR1 to TR10 included in the decoder areas 510, 520, 530, and 540 may be selected according to various criteria. For example, there are selected transistors TR1 to TR10 capable of minimizing lengths of conductive lines for forming a decoder. Alternatively, the transistors TR1 to TR10 may be selected from transistors placed in a specific chip area to increase (and/or maximize) the number of test target transistors. In addition, as the transistors TR1 to TR10 for forming a decoder, transistors having a relatively large size may be selected to improve decoding reliability or to provide high-voltage stability.

The decoder area 510 may include the transistors TR1 to TR10. However, it is understood that the number of transistors TR1 to TR10 is sufficient to form a decoder. The transistors TR1 to TR10 may be selected to have optimized locations or performance after a FEOL process. A decoder for selecting transistors 518 to be tested may be formed through routing about the selected transistors TR1 to TR10. Transistors TR1 to TR10 placed at remaining decoder areas 520, 530, and 540 may be selected in the same manner as the decoder area 510 and may be used to form a decoder through routing according to example embodiments of inventive concepts.

Locations and sizes of the decoder areas 510, 520, 530, and 540, the test target areas 518, 528, 538, and 548, and the pad areas 519, 529, 539, and 549 may be determined to reduced (and/or minimize) lengths of conductive lines needed to form a decoder. That is, to improve accuracy or efficiency of a test operation, a layout of a semiconductor device may be determined to reduced (and/or minimize) a distance between transistors to be tested and the decoder or a distance between a pad and the decoder.

Figure 16:
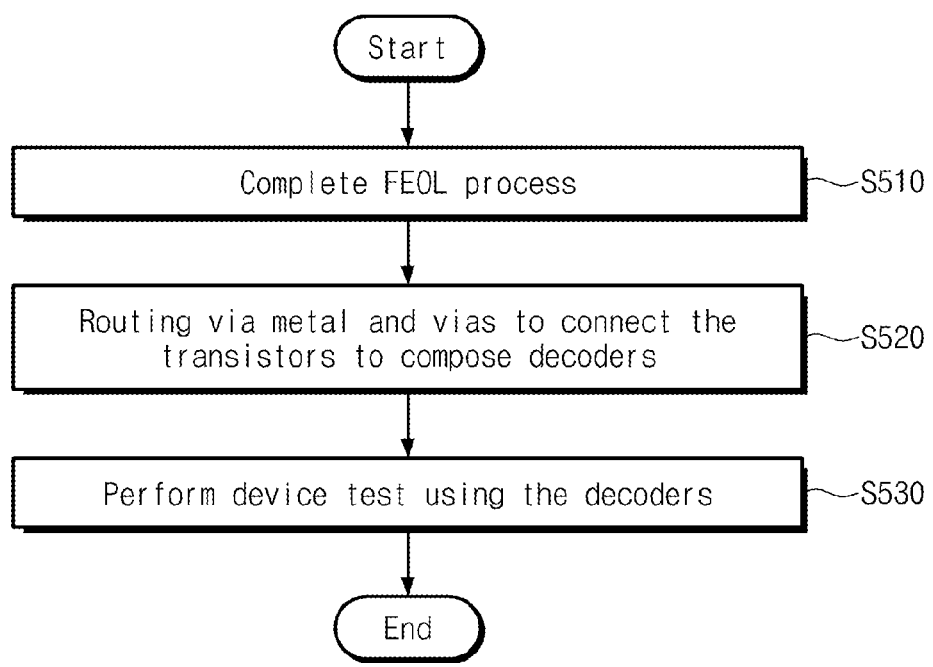
FIG. 16 is a flow chart schematically illustrating a device test method using a semiconductor device of FIG. 15.

FIG. 16 is a flow chart schematically illustrating a device test method using a semiconductor device 500 of FIG. 15. Referring to FIG. 16, a semiconductor device 500 according to example embodiments of inventive concepts includes decoder areas 510, 520, 530, and 540 and test target areas 518, 528, 538, and 548 after a FEOL process is completed.

In operation S510, a FEOL process of a semiconductor device 500 is performed to form elements, contacts, and various IPs of the semiconductor device 500. Elements, contacts, and lower metal lines of the semiconductor device 500 are formed through the FEOL process. If the FEOL process is completed, there are formed transistors and standard cells placed at the decoder areas 510, 520, 530, and 540 and the test target areas 518, 528, 538, and 548.

In S520, there is made routing about the semiconductor device 500 provided by the FEOL process. That is, some metal layers and vias of a semiconductor device formed by the FEOL process are removed, and routing about logic cells is made to form the decoder areas 510, 520, 530, and 540, the test target areas 518, 528, 538, and 548, and the pad areas 519, 529, 539, and 549 according to example embodiments of inventive concepts. Then, a decoder for selecting transistors is formed at each of the decoder areas 510, 520, 530, and 540. In addition, pads for receiving selection signals are formed at the decoders. Conductive lines are formed between the decoders and transistors selected by the decoders.

In operation S530, a test operation is sequentially performed with respect to a decoding unit (pad, decoder, and test target transistors). Alternatively, a test operation is performed in parallel with respect to at least two decoding units. One of a plurality of transistors is selected by a selection signal. If receiving a selection signal from a tester (or test equipment) through a pad, a decoder selects one transistor corresponding to a selection signal. Then, an electrical characteristic of the selected transistor is measured by the tester. This test operation is iterated until all transistors connected to the decoder are sensed.

There is described a test method according to example embodiments of inventive concepts where transistors are selected to form a decoder after a FEOL process. The number of locations of transistors constituting a decoder and the number of test target transistors to be selected by one decoder may be decided according to various purposes at a design level or a formation step of the semiconductor device 500 performed after the FEOL process.

Figure 17:
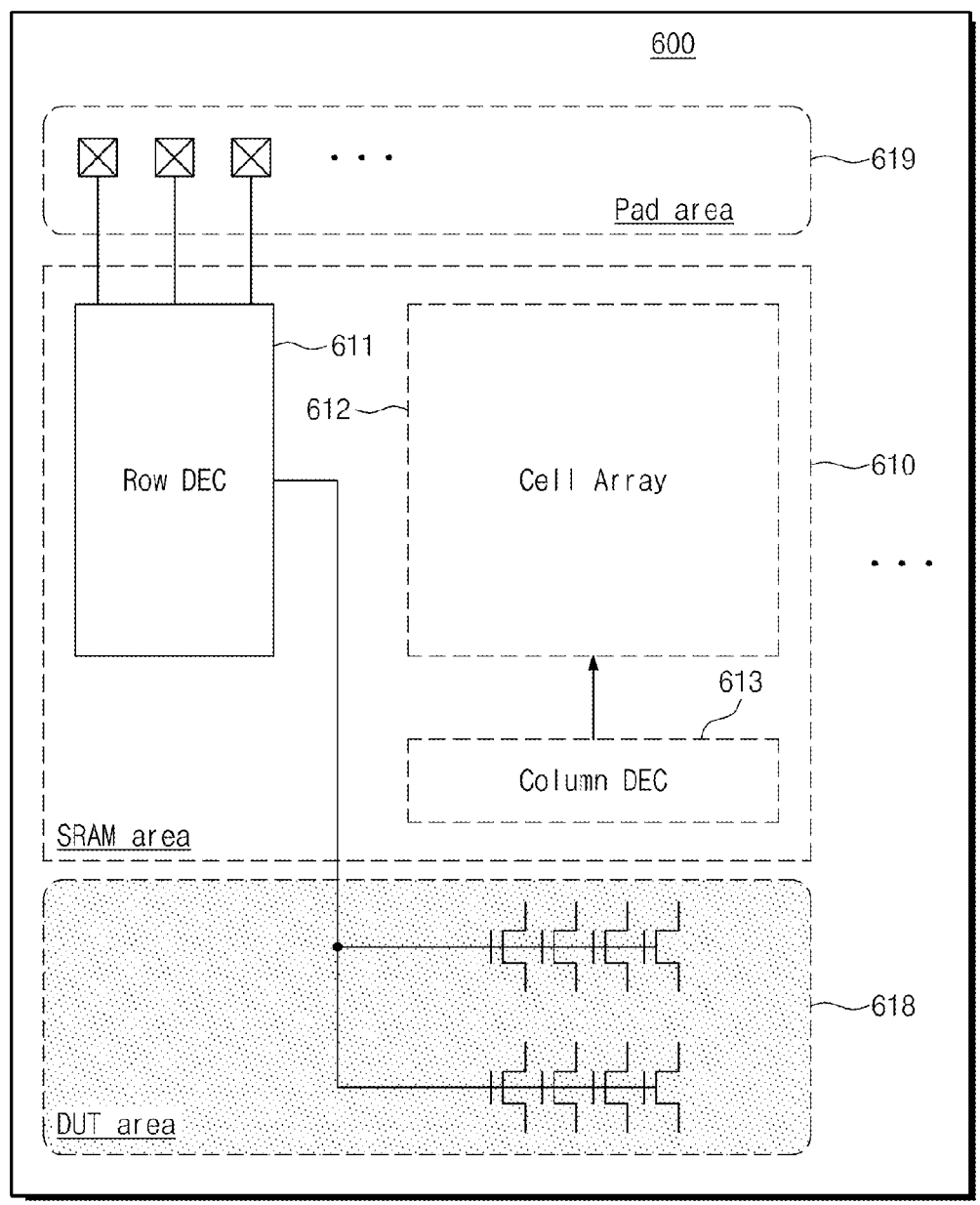
FIG. 17 is a block diagram schematically illustrating a semiconductor device for test according to example embodiments of inventive concepts.

FIG. 17 is a block diagram schematically illustrating a semiconductor device for test according to example embodiments of inventive concepts. Referring to FIG. 17, a semiconductor device for test 600 may use a decoder, used for an intellectual property (IP) such as an SRAM or a memory, as a decoder for selecting transistors for a test. The semiconductor device 600 contains an SRAM area 610 including a decoder 611, a test area 618, a cell array 612, and a pad area 619.

The SRAM area 610 is a chip area including at least one decoder circuits 611 and 613. The semiconductor device 600 such as an application processor may include a memory for various purposes, in general. For example, the semiconductor device 600 may include various memories such as an SRAM (used as a cache memory of a processor), a ROM, etc. Also, a decoder circuit using various circuit components other than a memory can be previously formed after a FEOL process. It may be apparent that the SRAM area 610 is various IPs or a memory area including a decoder circuit in designing.

The semiconductor device for test 600 according to example embodiments of inventive concepts reuses a decoder circuit of the semiconductor device 600 as a decoder for selecting test target transistors. For example, the row decoder 611 or the column decoder 613 of the SRAM area 610 may be used to form a decoder for selecting test target transistors according to example embodiments of inventive concepts. For the sake of description, it is assumed that the row decoder 611 is reused as a decoder for test. After a FEOL process is completed, some vias and metal layers are removed, and then gates of transistors of the test area 618 are connected with the row decoder 611. This connection between the row decoder 611 and transistors may be possible using masks in minimum. Likewise, at this time, the pad area 619 is formed. Some pads of the pad area 619 are connected with selection signal lines of the row decoder 611, and some pads are connected with a common source CS and a common drain CD of test target transistors.

Figure 18:
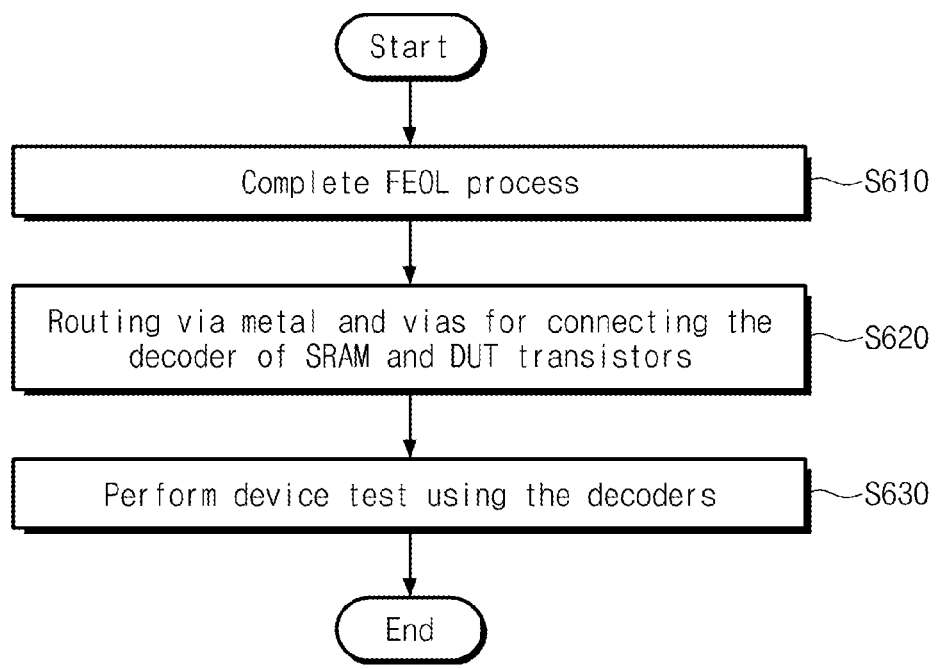
FIG. 18 is a flow chart schematically illustrating a device test method using a semiconductor device of FIG. 17.

FIG. 18 is a flow chart schematically illustrating a device test method using a semiconductor device 600 of FIG. 17. Referring to FIG. 18, a semiconductor device 600 according to example embodiments of inventive concepts reconfigures previously formed decoder circuits as a decoder for test after a FEOL process.

In operation S610, a FEOL process of a semiconductor device 600 is performed to form elements, contacts, and various IPs of the semiconductor device 600. Circuit blocks, elements, contacts, and lower metal lines of the semiconductor device 600 are formed through the FEOL process. If the FEOL process is completed, decoder circuits 611 and 613 of an SRAM area 610 are formed.

In S620, there is made routing about the semiconductor device 600 provided by the FEOL process. That is, some metal layers and vias of a semiconductor device formed by the FEOL process are removed, and a decoder circuit (e.g., a row decoder 611) of an SRAM area 610 and transistors of a test area 618 are electrically connected. That is, a via for connecting an output terminal of the row decoder 611 and a metal layer is formed, and a metal layer is formed. A pad area 619 is formed when the metal layer is formed. That is, there are formed pads connected with an input terminal of the row decoder 611 and pads connected with a common source CS or a common drain CD of the test area 618.

In operation S630, a test operation is sequentially performed with respect to test target transistors. If receiving a selection signal from a tester (or test equipment) through pads, the row decoder 611 selects one transistor in response to the selection signal. Then, the selected transistor is turned on, and a channel current or voltage is measured by the tester via pads connected with the common source and the common drain. Selecting and measuring of transistors are performed until all transistors of the test area 618 are measured.

There is described a method for reusing a previously existing decoder circuit after a FEOL process to form a decoder. An SRAM is may be in a device including a decoder circuit. However, the example embodiments are not limited thereto. It may be apparent that a decoder included in various circuits or an intellectual property is reused as a decoder for test according to example embodiments of inventive concepts.

Figure 19:
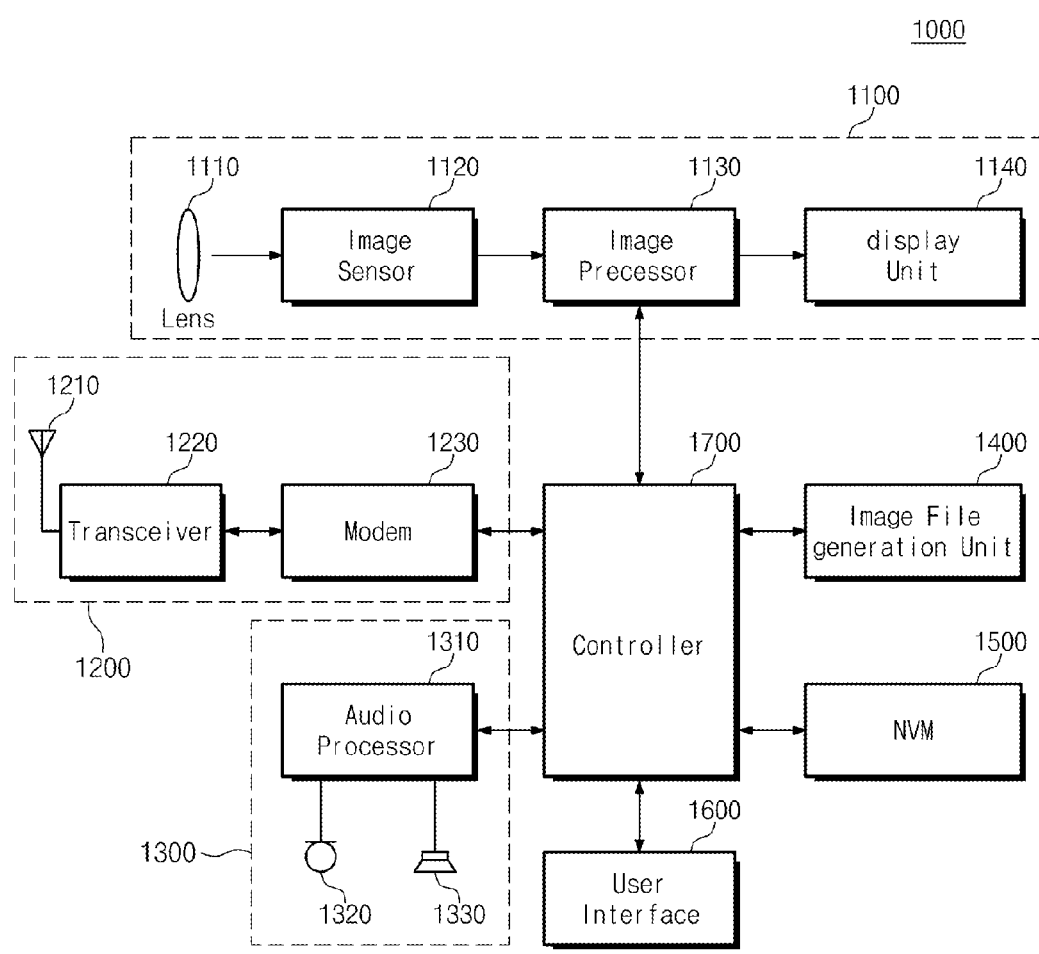
FIG. 19 is a block diagram schematically illustrating a portable terminal including a semiconductor device, according to example embodiments of inventive concepts.

FIG. 19 is a block diagram schematically illustrating a portable terminal including a semiconductor device, according to example embodiments of inventive concepts. Referring to FIG. 19, a portable terminal 1000 according to example embodiments of inventive concepts contains an image processing unit 1100, an RF transceiver unit 1200, an audio processing unit 1300, an image file generating unit 1400, a memory 1500, a user interface 1600, and a controller 1700.

The image processing unit 1100 includes a lens 1110, an image sensor 1120, an image processor 1130, and a display unit 1140. The RF transceiver unit 1200 includes an antenna 1210, a transceiver 1220, and a modem 1230. The audio processing unit 1300 includes an audio processor 1310, a microphone 1320, and a speaker 1330.

The portable terminal 1000 may include various sorts of semiconductor devices. In particular, an application processor performing a function of the controller 1700 may be implemented with a system on chip in which a plurality of IPs is embedded. In this case, relatively highly integrated devices are formed, and a test about more transistors is required to improve yield. If a test method according to example embodiments of inventive concepts is applied to a semiconductor device forming the controller 1700 to satisfy this need, it is possible to measure elements of which the number is markedly increased.

A memory system according to example embodiments of inventive concepts may be packaged according to any of a variety of different packaging technologies. Examples of such packaging technologies may include the following: PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

According to a semiconductor device and a test method thereof, effective device selection about a chip of a FEOL process level is possible, thereby markedly increasing the number of elements to be tested. Also, efficiency of monitoring devices is increased (and/or maximized) at a manufacturing level of a semiconductor device, thereby improving yield.

While inventive concepts have been described with reference to some example embodiments, it will be apparent to those skilled in the art that various changes and modifications may be made without departing from the spirits and scope of inventive concepts. Therefore, it should be understood that the above embodiments are not limiting, but illustrative.

What is claimed is:

1. A method for forming a semiconductor device for test, comprising:
   performing a Front End of Line (FEOL) process that includes forming a plurality of elements or a plurality of logic cells including vias and metal lines at an upper layer portion on a plurality of transistors including gates;
   forming a selection logic for selecting at least one of the plurality of transistors, using at least one of the plurality of elements or the plurality of logic cells;
   connecting the selection logic and the plurality of transistors;
   forming a pad for connecting an input terminal of the selection logic and the gates of the plurality of transistors, wherein
   the selection logic is configured to select the at least one of the plurality of transistors by turning on the at least one of the plurality of transistors while unselected transistors among the plurality of transistors are turned off, and
   the forming the selection logic includes removing the vias and metal lines formed at the upper layer portion of the plurality of elements or the plurality of logic cells formed at the semiconductor device after the FEOL process is performed.

2. The method of claim 1, wherein the plurality of elements are elements placed at a specific chip area of the semiconductor device.

3. The method of claim 1, wherein the plurality of logic cells are standard logic cells at the semiconductor device.

4. The method of claim 1, wherein
the plurality of logic cells include logic filler cells that are cells assigned to filler cells at a design level of the semiconductor device, and
the logic filler cells are formed to have the same function of a standard logic cell.

5. The method of claim 4, wherein
the logic filler cells and the standard logic cells each include input and output terminals,
the FEOL process of the forming the plurality of elements or the plurality of logic cells includes forming the input and output terminals of the logic filler cells so they are separated from the input and output terminals of standard logic cells.

6. The method of claim 1, wherein the selection logic is implemented with a decoder intellectual property (IP) formed at a specific chip area according to locations of the plurality of transistors at a design level of the semiconductor device.

7. The method of claim 1, wherein the forming the selection logic includes routing a decoder circuit previously formed for a specific function at the semiconductor device.

8. The method of claim 1, further comprising:
forming a contact or a conductive line for forming the selection logic after the removing the vias and the metal lines.

9. A method for forming a semiconductor device for test, comprising:
forming transistors and at least one of elements, logic cells, and intellectual properties (IPs) for the semiconductor device for test using a FEOL process, the transistors including gates, drains, and sources;
forming a decoder for sequentially selecting the transistors in response to a selection signal, the forming the decoder including one of,
selecting one of standard cells or elements corresponding to positions where minimum conductive lines are needed when forming the decoder, and forming the decoder from the selected one of the standard cells or elements, and
selecting one of the standard cells or elements that has a size larger than a reference size and modifying the selected one of the standard cells or elements into the decoder;
connecting the decoder to the transistors; and
forming a pad for connecting an input terminal of the decoder to the gates of the transistors.

10. The method of claim 9, further comprising:
disposing at least one of elements, logic cells, and intellectual properties (IPs) for forming a decoder at a chip area of the semiconductor device for test, wherein
the disposing the transistors and the at least one of elements, logic cells, and intellectual properties (IPs) includes selecting an element or logic cell configured to perform a specific function among the elements or the logic cells.

11. The method of claim 9, wherein the forming the decoder includes the selecting one of the standard cells or elements corresponding to positions where minimum conductive lines are needed when forming the decoder, and forming the decoder from the selected one of the standard cells or elements.

12. The method of claim 9, wherein the forming the decoder includes the selecting one of the standard cells or elements that has a size larger than a reference size and modifying the selected one of the standard cells or elements into the decoder.

13. The method of claim 9, further comprising:
disposing at least one of elements, logic cells, and intellectual properties (IPs) for forming a decoder at a chip area of the semiconductor device for test, wherein
the disposing includes deciding a number, locations, and a decoding size of the IPs according to the pad and a number of transistors or locations of the pad and the transistors.

14. The method of claim 9, further comprising:
removing vias or metal lines after the FEOL process.

15. A method for testing target transistors on a Front End of Line (FEOL)-end-semiconductor device, the FEOL-end-semiconductor device including the target transistors and at least one of a plurality of elements and a plurality of logic cells formed using a FEOL process, the target transistors each including a source, a gate, and a drain, the method comprising:
forming a decoder by modifying the at least one of the plurality of elements and the plurality of logic cells on the FEOL-end-semiconductor device;
forming a pad pattern, the pad pattern defining an input terminal connected to the decoder, a source terminal connected to a source of at least one of the target transistors, and a drain terminal connected to a drain of at least one of the target transistors;
connecting the decoder to the gates of the target transistors;
selecting a selected target transistor among the target transistors using the decoder, the selecting the selected target transistor including turning the selected target transistor on while unselected target transistors among the target transistors are turned off, and
measuring an electrical characteristic of the selected target transistor using the source terminal and the drain terminal, wherein
the at least one of the plurality of elements and the plurality of logic cells on the FEOL-end-semiconductor device are connected to vias and metal lines, and the forming the decoder includes removing the vias and the metal lines connected to the at least one of the plurality of elements and the plurality of logic cells on the FEOL-end-semiconductor device and routing a new interconnection structure to the at least one of the plurality of elements and the plurality of logic cells being modified into the decoder, or
the FEOL-end-semiconductor device includes a circuit block divided into a plurality of rows on a basis of power rails,
each of the rows includes standard logic cells, logic filler cells, and general filler cells, the forming the decoder includes modifying one of the logic filler cells into the decoder, and
the connecting the decoder to the gates of the target transistors includes connecting the decoder to gates of the standard logic cells in a same row as the decoder.

16. The method of claim 15, wherein
the sources of the target transistors are connected to a common source, the drains of the target transistors are connected to a common drain, and the forming the pad pattern includes forming the source terminal connected to the common source and forming the drain terminal connected to the common drain.

17. The method of claim 15, wherein the at least one of the plurality of elements and the plurality of logic cells on the FEOL-end-semiconductor device are connected to vias and metal lines, and the forming the decoder includes removing the vias and the metal lines connected to the at least one of the plurality of elements and the plurality of logic cells on the FEOL-end-semiconductor device and routing the new interconnection structure to the at least one of the plurality of elements and the plurality of logic cells being modified into the decoder.

18. The method of claim 15, wherein the FEOL-end-semiconductor device includes the circuit block divided into the plurality of rows on the basis of power rails, each of the rows includes standard logic cells, logic filler cells, and general filler cells, the forming the decoder includes modifying one of the logic filler cells into the decoder, and the connecting the decoder to the gates of the target transistors includes connecting the decoder to gates of the standard logic cells in the same row as the decoder.

19. The method of claim 15, wherein the forming the decoder includes forming the decoder to include at least one inverter and at least one NAND gate.

* * * * *